US010828665B2

(12) United States Patent
Stiff-Roberts et al.

(10) Patent No.: US 10,828,665 B2
(45) Date of Patent: Nov. 10, 2020

(54) METHODS AND SYSTEMS FOR DEPOSITION OF BLENDED POLYMER FILMS

(71) Applicant: Duke University, Durham, NC (US)

(72) Inventors: Adrienne D. Stiff-Roberts, Durham, NC (US); Ryan D. McCormick, Durham, NC (US)

(73) Assignee: Duke University, Durham, NC (US)

( * ) Notice: Subject to any disclaimer, the term of this patent is extended or adjusted under 35 U.S.C. 154(b) by 330 days.

(21) Appl. No.: 15/507,290

(22) PCT Filed: Sep. 4, 2015

(86) PCT No.: PCT/US2015/048544
§ 371 (c)(1),
(2) Date: Feb. 28, 2017

(87) PCT Pub. No.: WO2016/037057
PCT Pub. Date: Mar. 10, 2016

(65) Prior Publication Data
US 2017/0282214 A1 Oct. 5, 2017

Related U.S. Application Data

(60) Provisional application No. 62/045,743, filed on Sep. 4, 2014.

(51) Int. Cl.
*B05D 3/06* (2006.01)
*B05D 1/00* (2006.01)
(Continued)

(52) U.S. Cl.
CPC .............. *B05D 3/06* (2013.01); *B01F 3/0815* (2013.01); *B05D 1/002* (2013.01); *B05D 1/60* (2013.01);
(Continued)

(58) Field of Classification Search
CPC . B05D 3/06; B05D 1/002; B05D 1/60; B05D 2201/02; B05D 2401/10;
(Continued)

(56) References Cited

U.S. PATENT DOCUMENTS

| 2010/0196665 A1 | 8/2010 | Masuda et al. |
| 2011/0019277 A1 | 1/2011 | Sager et al. |
| 2014/0227461 A1* | 8/2014 | Darwish ................. C23C 14/06 427/596 |

OTHER PUBLICATIONS

Ryan Pate, et al; "RIR-MAPLE deposition of conjugated polymers for application to optoelectronic devices." Applied Physics A. Sep. 24, 2011, vol. 105, Issue 3, pp. 555-563. DOI: 10.1007/s00339-011-6598-3.

(Continued)

*Primary Examiner* — Robert S Walters, Jr.
(74) *Attorney, Agent, or Firm* — Olive Law Group, PLLC

(57) ABSTRACT

Methods and systems for deposition of blended polymer films are disclosed. According to an aspect a method of producing a film on a substrate includes combining a guest material, a host matrix, and a solvent having one or more hydroxyl (O—H) bonds to form a target emulsion. The method also includes exposing the target emulsion to an infrared source that is tuned to an absorption peak in the host matrix that is reduced in or absent from the guest material thereby desorbing the host matrix from the target emulsion and lifting the guest material from the surface of the target emulsion. The target emulsion and the substrate are oriented with respect to each other such that the lifted guest material is deposited as a film upon the substrate.

43 Claims, 15 Drawing Sheets

TOP VIEW of MAPLE Target

(51) Int. Cl.
    C23C 14/28     (2006.01)
    C23C 14/12     (2006.01)
    B01F 3/08      (2006.01)
    C08J 5/18      (2006.01)
    H01S 3/16      (2006.01)
    B05D 3/02      (2006.01)

(52) U.S. Cl.
    CPC ............. *C08J 5/18* (2013.01); *C23C 14/12* (2013.01); *C23C 14/28* (2013.01); *H01S 3/1643* (2013.01); *B05D 3/0218* (2013.01); *B05D 2201/02* (2013.01); *B05D 2401/10* (2013.01)

(58) Field of Classification Search
    CPC ........ B05D 3/0218; B01F 3/0815; C08J 5/18; H01S 3/1643; C23C 14/28; C23C 14/12
    See application file for complete search history.

(56) References Cited

OTHER PUBLICATIONS

Qian Yu, et al; "RIR-MAPLE deposition of multifunctional films combining biocidal and fouling release properties." Journal of Materials Chemistry B. May 21, 2014. Issue 27, pp. 4371-4374. DOI: 10.1039/c4tb00566j.

S. Singaravelu, et al; "Anti-reflective polymer-nanocomposite coatings fabricated by RIR-MAPLE." Laser Applications in Microelectronic and Optoelectronic Manufacturing XVIII. 2013. vol. 8607, pp. 1-6.

International Search Report and Written Opinion for PCT/US2015/048544 dated Feb. 3, 2016.

International Preliminary Report for PCT/US2015/048544 dated Mar. 7, 2017.

* cited by examiner

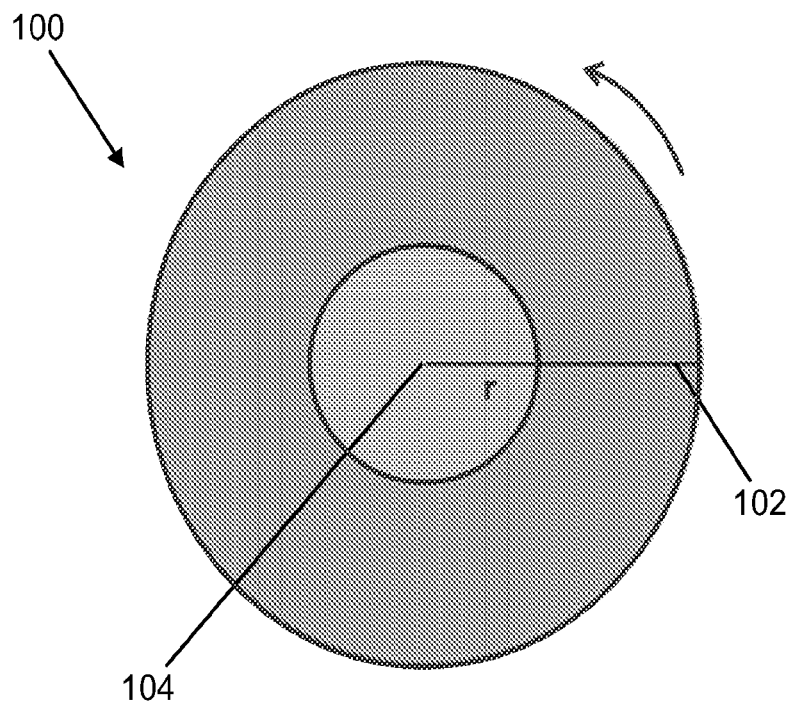
TOP VIEW of MAPLE Target    FIG. 1
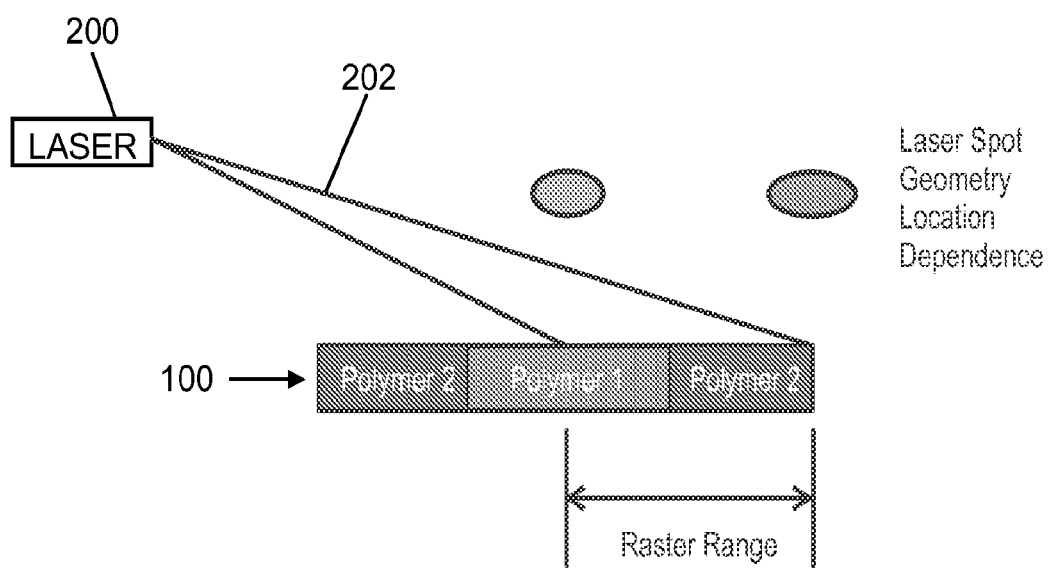
SIDE VIEW of MAPLE Target
FIG. 2

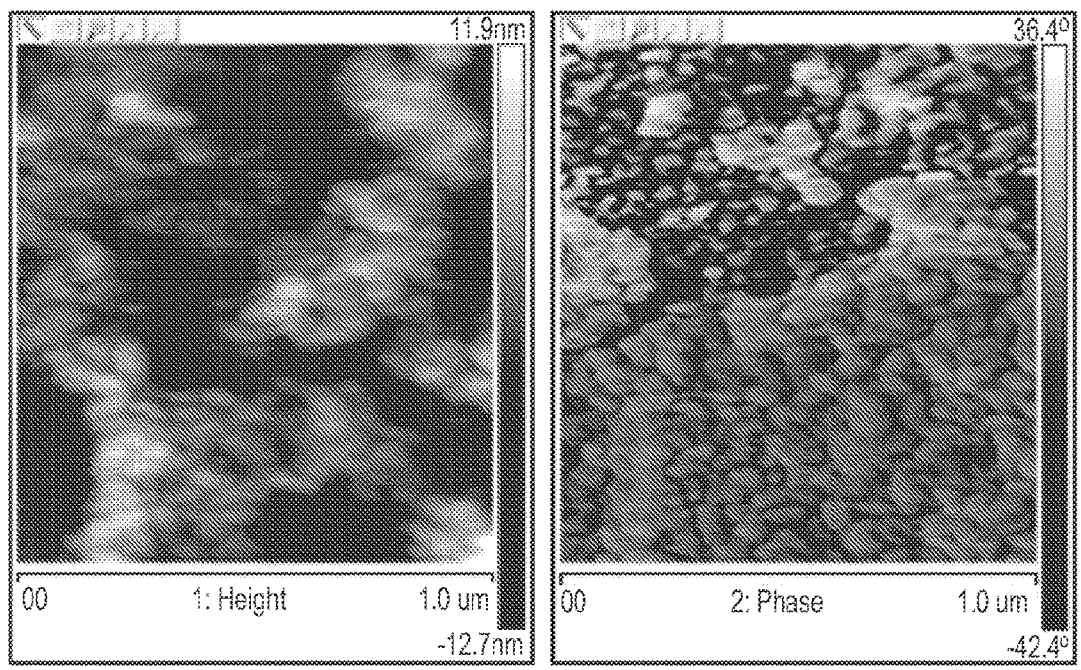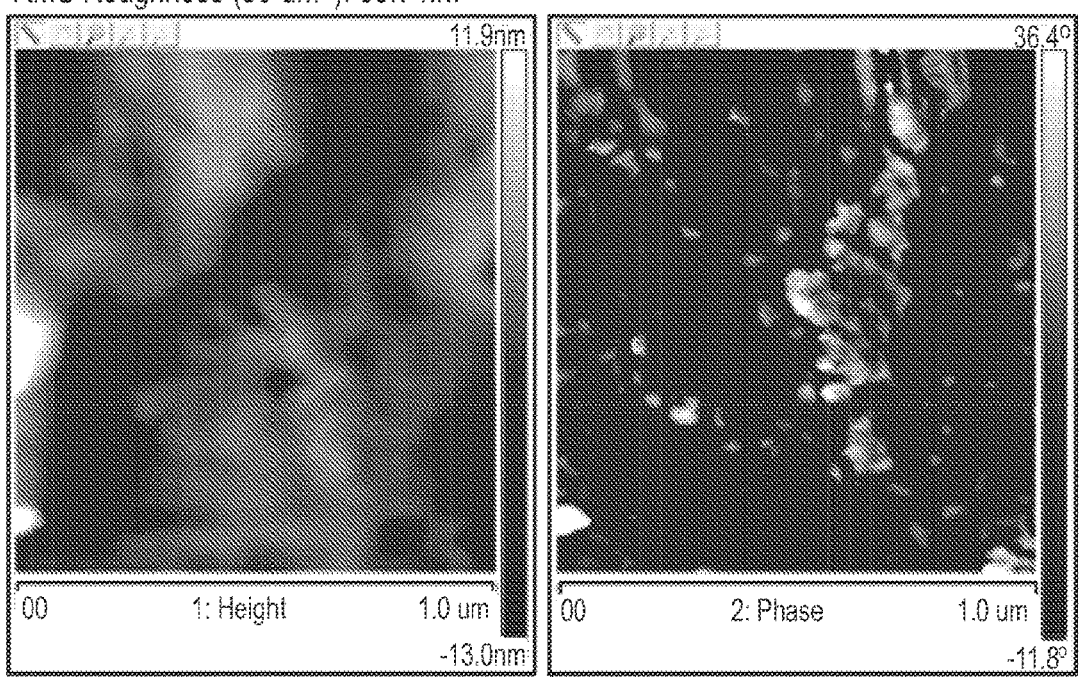
FIG. 7

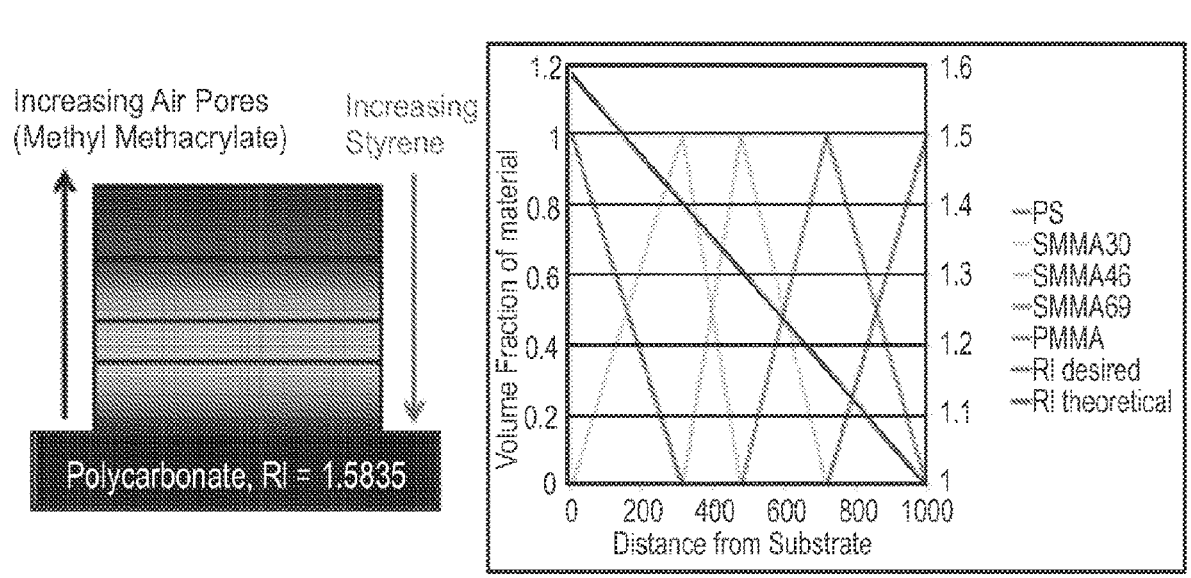
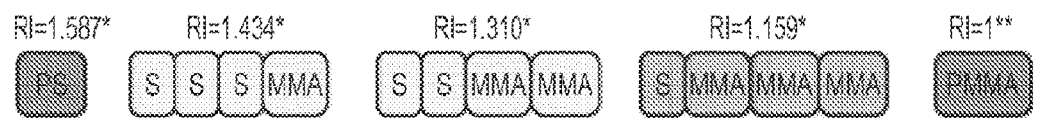
FIG. 9
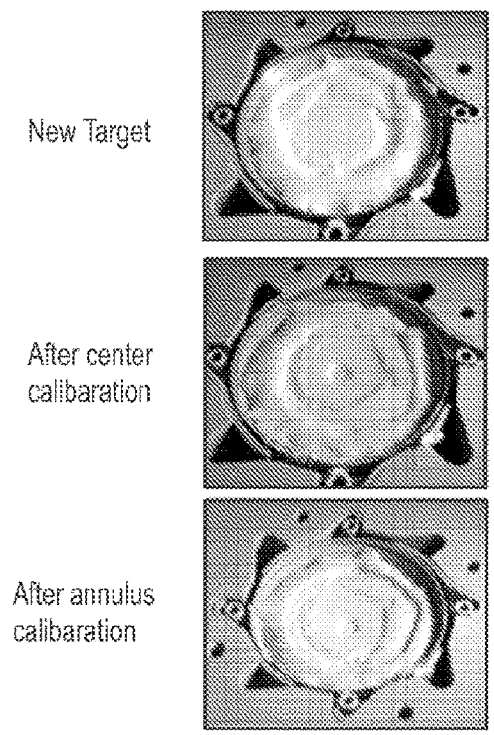
FIG. 10

METHODS AND SYSTEMS FOR DEPOSITION OF BLENDED POLYMER FILMS

CROSS REFERENCE TO RELATED APPLICATION

This is a 371 national stage patent application, which claims priority to PCT International Patent Application No. PCT/US2015/048544, filed Sep. 4, 2015, and titled METHODS AND SYSTEMS FOR DEPOSITION OF BLENDED POLYMER FILMS, which claims the benefit of U.S. Provisional Patent Application No. 62/045,743, filed Sep. 4, 2014 and titled SYSTEMS AND METHODS FOR THE DEPOSITION OF BLENDED POLYMER FILMS, the disclosure of which is incorporated herein by reference in its entirety.

FEDERALLY SPONSORED RESEARCH OR DEVELOPMENT

This invention was made with government support under Federal Grant No. FA9550-12-C-0007 awarded by the United States Air Force. The Government has certain rights to this invention.

TECHNICAL FIELD

The present subject matter relates to methods and systems for deposition of blended polymer films.

BACKGROUND

Graded index films enable enhanced control over the reflection and transmission properties of optical components, such as waveguides and anti-reflection (AR) coatings, by continuously varying the refractive index (RI) between two different materials. AR coatings, in particular, can be important for improving the performance of applications such as optical displays, goggles, and optoelectronic devices such as LEDs and solar cells (see, e.g., Zhang, L. et al. 2008, *Langmuir* 24(19):10851; Bilyalov, R. et al. 2003, *Electrochemical Society* 150(3):G216; and Ishikawa, H. et al. 1999 *Thin Solid Films* 351(1-2):212). Two materials of mismatched RI will reflect a portion of incident light at the interface, thereby reducing the transmission of light required for a given application. A quarter- or half-wave stack will provide improved transmission at specific wavelengths and incident angles, but it will not give broad spectral or angular performance (see, e.g., MacLeod, H. A. *Thin Film Optical Filters* Adam Hilger Ltd., Bristol, UK (1986)); conversely, a graded index coating can provide such performance (Li, X. et al. 2010 *Adv. Functional Materials*, 20(2):259). While existing commercial AR coatings comprising inorganic materials feature effective broadband anti-reflection for rigid glass substrates, they have proven difficult to deposit on plastic substrates, such as polycarbonate, and suffer from delamination and durability issues dues to poorly matched coefficients of thermal expansion (CTE).

Previously, organic graded index films have been used since they can provide a better match of the CTE and better adhesion to polymeric substrates. In such instances, polymeric graded index films have been fabricated by nanoimprint lithography and by the decomposition of one component from polymer blends (see, e.g., Ting, C.-J. et al. 2008, *J. of Micromechanics and Microengineering* 18(7):075001; Li, X. et al. 2010, supra). The polymer blend approach is attractive because precise control of the film composition, i.e., the ratio of two polymers in the blend, can determine the porosity, and consequently, the refractive index after decomposition of the porogen component. Importantly, the polymer blend and decomposition approach to graded index polymer films has used spin-casting of homopolymers and block copolymers, as well as selective migration, in order to achieve the desired nanoscale domains. However, such processes are difficult to control in order to achieve a desired RI, and modification of the process to match the optical properties of different substrates is limited.

In view of the foregoing, there is a need for improved techniques for blending polymers.

SUMMARY

Disclosed herein are methods and systems for deposition of blended polymer films. According to an aspect a method of producing a film on a substrate includes combining a guest material, a host matrix, and a solvent having one or more hydroxyl (O—H) bonds to form a target emulsion. The method also includes exposing the target emulsion to an infrared source that is tuned to an absorption peak in the host matrix that is reduced in or absent from the guest material thereby desorbing the host matrix from the target emulsion and lifting the guest material from the surface of the target emulsion. The target emulsion and the substrate are oriented with respect to each other such that the lifted guest material is deposited as a film upon the substrate.

According to another aspect, a method of producing a film on a substrate. The method includes combining a guest material, a first host matrix, a second host matrix, and a solvent having a hydroxyl (O—H) bond to form a target emulsion, wherein the first host matrix is as or less volatile than the first host matrix. The method also includes exposing the target emulsion to an infrared source that is tuned to an absorption peak in the host matrix that is reduced in or absent from the guest material thereby desorbing the host matrix from the target emulsion and lifting the guest material from the surface of the target emulsion. The target emulsion and the substrate are oriented with respect to each other such that the lifted guest material is deposited as a film upon the substrate.

According to another aspect, a step of combining the guest material, first and second host matrices, and solvent includes dissolving the guest material in the host matrices.

According to another aspect, the host matrices are more volatile than the guest material.

According to another aspect, exposing the first and second host matrices of the target emulsion to the infrared source excites specific molecular vibrational bond stretches that reduce degradation of the guest material.

According to another aspect, the infrared source comprises a wavelength that is resonant with hydroxyl (O—H) bonds.

According to another aspect, the wavelength comprises a range of about 2.7 μm to about 3.4 μm.

According to another aspect, the wavelength comprises a range of about 2.82 μm to about 3.1 μm.

According to another aspect, the infrared source comprises a laser.

According to another aspect, the laser comprises an Er:YAG laser.

According to another aspect, the guest material comprises one of a polymer, a small molecule, a nanoparticle, a biologic, and combinations thereof.

According to another aspect, the polymer comprises one of a linear conjugated polymer, a linear nonconjugated polymer, a polyelectrolyte, a stimuli-responsive polymer, an ionomer, and combinations thereof.

According to another aspect, the linear conjugated polymer comprises one of polythiophene (PT), poly(p-phenylene vinylene) (PPV), polypyrrole (PPY), polyaniline (PANI), polyacetylene, polyparaphenylene (PPP), structural analogs thereof, functional analogs thereof, copolymers thereof and combinations thereof.

According to another aspect, the linear nonconjugated polymer comprises one of polyacrylates, polystyrenes, structural analogs thereof, functional analogs thereof, copolymers thereof and combinations thereof.

According to another aspect, the polyelectrolyte comprises one of poly(phenylene ethynylene)(PPE), structural analogs thereof, functional analogs thereof, copolymers thereof, and combinations thereof.

According to another aspect, the stimuli-responsive polymer comprises one of poly(N-isopropylacrylamide) (PNIPAAm), structural analogs thereof, functional analogs thereof, copolymers thereof, and combinations thereof.

According to another aspect, the ionomer comprises one of poly(3,4-ethylenedioxythiophene) and polystyrene sulfonate, a mixture (PEDOT:PSS) thereof, structural analogs thereof, functional analogs thereof, copolymers thereof, and combinations thereof.

According to another aspect, the small molecule comprises one of a fullerene, a phthalocyanine, a chromophore, a quaternary ammonium salts (QAS) structural analog thereof, functional analogs thereof, and combinations thereof.

According to another aspect, the chromophore comprises one of ruthenium dyes, ethyl violet dyes, and disperse red 1 dyes.

According to another aspect, the nanoparticle comprises one of quantum dots, a nanowire, a nanotube, and combinations thereof.

According to another aspect, the quantum dots comprise one of solid or core/shell configurations of inorganic semiconductor materials, metallic nanoparticles, metal oxide nanoparticles, and combinations thereof.

According to another aspect, the solid or core/shell configurations of inorganic semiconductor materials comprise one of II-VI, III-V, IV-VI binary compounds, group IV materials, and combinations thereof.

According to another aspect, the metallic nanoparticles comprise one of gold, silver, and combinations thereof.

According to another aspect, the metal oxide nanoparticles comprise one of zinc oxides, titanium oxides, and combinations thereof.

According to another aspect, the biologic comprises one of proteins, deoxyribonucleic acid (DNA), ribonucleic acid (RNA), complementary DNA (cDNA), oligopeptides, polypeptides, oligosaccharides, polysaccharides, lipids, proteins, and other biologically-derived material.

According to another aspect, the target emulsion is frozen.

According to another aspect, the first host matrix comprises one of aromatic compounds, alcohols, ketones, and halocarbons.

According to another aspect, the second host matrix comprises a material less volatile than the first host matrix and contains at least one O—H bond.

According to another aspect, the aromatic compounds comprise one of toluene, xylene, mesitylene, chlorobenzene, dichlorobenzene, trichlorobenzene, tetrahydrofuran, and combinations thereof.

According to another aspect, the alcohols comprise one of methanol, ethanol, isopropanol, benzyl alcohol, and phenol.

According to another aspect, the ketones comprise one of acetone and methyl ethyl ketone (MEK).

According to another aspect, the halocarbons comprise one of trichloroethylene and chloroform.

According to another aspect, the substrate comprises a silicon-based readout circuit.

According to another aspect, the substrate comprises a piezoelectric material.

According to another aspect, the substrate comprises one of a chemical sensing device and a biochemical sensing device.

According to another aspect, the substrate comprises an acoustic wave device.

According to another aspect, the substrate comprises a non-planar surface.

According to another aspect, the method further includes repeating the steps of combining and exposing with a plurality of guest materials to thereby create a multi-layer film on the substrate.

According to another aspect, the target emulsion is partitioned to accommodate multiple material solutions or emulsions such that the infrared source can address each target material region selectively and instantaneously in order to control in real time the material ratio in the deposited film.

According to another aspect, the target emulsion is partitioned into concentric rings, wherein each ring comprises a single guest material.

According to another aspect, the method further includes rotating the target emulsion such that the infrared source rasters along one or between two or more of the concentric rings.

According to another aspect, the target emulsion is partitioned into linear adjacent, parallel, non-overlapping regions.

According to another aspect, the target emulsion is partitioned into a compact series of square or rectangular non-overlapping regions that are organized in a row-and-column pattern.

BRIEF DESCRIPTION OF THE DRAWINGS

The foregoing aspects and other features of the present subject matter are explained in the following description, taken in connection with the accompanying drawings, wherein:

FIG. 1 is a top view of an example slide of a target emulsion having a disc shape with concentric rings in accordance with embodiments of the present disclosure;

FIG. 2 is a side view of the example slide of the target emulsion shown in FIG. 1;

FIG. 7 are AFM images of results obtained for RIR-MAPLE thin-film deposition of a polymer blend including the diblock copolymers and homopolymers polystyrene (PS) or poly(methyl methacrylate) (PMMA) for application to optical AR coatings;

FIG. 9 depicts an example of a gradient refractive index film in accordance with embodiments of the present disclosure;

FIG. 10 depicts images shows a sequence of example target ablation progression during one of the depositions for the GRIN film the present disclosure;

DETAILED DESCRIPTION

Figure 3:
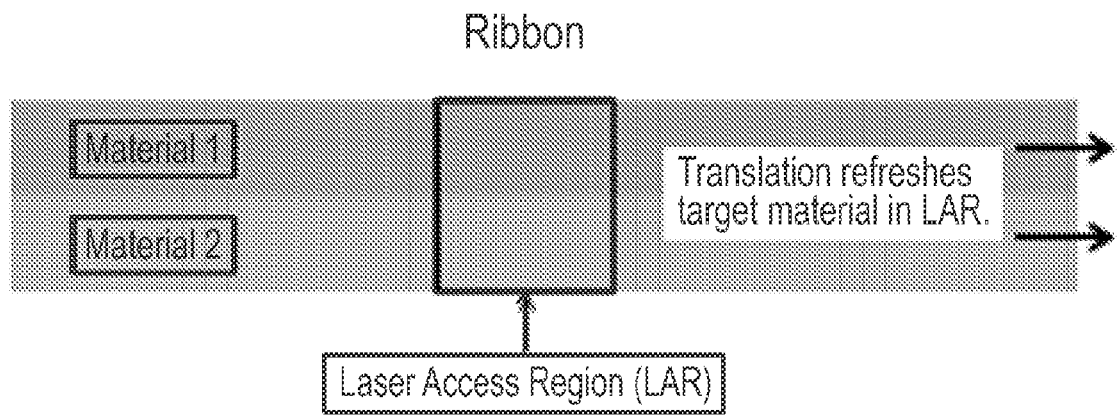
FIGS. 3 and 4 show an example target emulsion as being partitioned into a compact series of square or rectangular non-overlapping regions that are organized in a row and column pattern.

For the purposes of promoting an understanding of the principles of the present disclosure, reference will now be made to various embodiments and specific language will be used to describe the same. It will nevertheless be understood that no limitation of the scope of the disclosure is thereby intended, such alteration and further modifications of the disclosure as illustrated herein, being contemplated as would normally occur to one skilled in the art to which the disclosure relates.

Articles "a" and "an" are used herein to refer to one or to more than one (i.e. at least one) of the grammatical object of the article. By way of example, "an element" means at least one element and can include more than one element.

In this disclosure, "comprises," "comprising," "containing" and "having" and the like can have the meaning ascribed to them in U.S. Patent law and can mean "includes," "including," and the like; "consisting essentially of" or "consists essentially" likewise has the meaning ascribed in U.S. Patent law and the term is open-ended, allowing for the presence of more than that which is recited so long as basic or novel characteristics of that which is recited is not changed by the presence of more than that which is recited, but excludes prior art embodiments.

Ranges provided herein are understood to be shorthand for all of the values within the range. For example, a range of 1 to 50 is understood to include any number, combination of numbers, or sub-range from the group consisting 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50.

Unless specifically stated or obvious from context, as used herein, the term "about" is understood as within a range of normal tolerance in the art, for example within 2 standard deviations of the mean. The term "about" can be understood as within 10%, 9% 8%, 7%, 6%, 5%, 4%, 3%, 2%, 1%, 0.5%, 0.1%, 0.05%, or 0.01% of the stated value. Unless otherwise clear from context, all numerical values provided herein are modified by the term "about."

Unless otherwise defined, all technical terms used herein have the same meaning as commonly understood by one of ordinary skill in the art to which this disclosure belongs.

The present disclosure provides systems and methods for the deposition of blended polymer films with variable composition on a substrate. The method is particularly useful for organic graded index films by allowing for the precise control and tuning of the film composition of polymer blends as film deposition proceeds such that a precise graded index AR coating can be fabricated. Moreover, the methods provided herein provide the ability to deposit multi-layered films regardless of the constituent material solubility.

In accordance with embodiments of the present disclosure, a method of producing a film on a substrate includes combining a guest material, a host matrix, and a solvent having a hydroxyl (O—H) bond to form a target emulsion. The method also includes exposing the target emulsion to an infrared source that is tuned to an absorption peak in the host matrix that is reduced in or absent from the guest material thereby desorbing the host matrix from the target emulsion and lifting the guest material from the surface of the target emulsion. The target emulsion and the substrate is oriented with respect to each other such that the lifted guest material is deposited as a film upon the substrate.

The substrate of the present disclosure may be any solid having a surface of any shape, composition, or orientation. In some embodiments, the substrate comprises a non-planar surface, such as a curved surface. The method of the present disclosure can be particularly useful in instances where the substrate is a component of a chemical or biochemical sensing device of the type that includes a substrate, a film coating of a chemoselective or bioselective material on the substrate and a means for detecting the interaction of the chemoselective or bioselective material with a chemical or biochemical analyte. Examples of such devices include, but are not limited to, surface acoustic wave (SAW) devices, bulk acoustic wave (BAW) devices, plate acoustic wave devices, interdigitated microelectrode (IME) devices, optical waveguide (OW) devices and surface plasmon resonance devices. The composition of the substrate can depend upon the type of device. For example, when the substrate is a component of an SAW device, the substrate may include a piezoelectric material. In other embodiments, the substrate may comprise a silicon-based readout circuit.

Guest material may be any suitable material that is to be deposited onto a substrate. For example, in a chemical or biochemical sensing device, the guest material can be selected for its ability to interact selectively with a particular chemical or biological analyte. Criteria for selecting such a guest material are specific for the particular purpose and readily determinable by one skilled in the art. In some embodiments of the present disclosure, the guest material may comprise a polymer. The chemoselectivity can be derived from pendant functional groups that extend outward from the polymer backbone. An example purpose of the methods disclosed herein is to create uniform, adherent coatings of these materials without disrupting or damaging the functional groups. Polymers suitable for use in the present disclosure include, but are not limited to, the following: linear conjugated polymers, polythiophene (PT), poly(p-phenylene vinylene) (PPV), polypyrrole (PPY), polyaniline (PANI), polyacetylene, polyparaphenylenes (PPP), structural analogs thereof, functional analogs thereof, copolymers thereof and combinations thereof; linear non-conjugated polymers, such as such as polyacrylates, polystyrenes, structural analogs thereof, functional analogs thereof, copolymers thereof and combinations thereof; polyelectrolytes, such as poly(phenylene ethynylene)(PPE), structural analogs thereof, functional analogs thereof, copolymers thereof and combinations thereof; stimuli-responsive polymers, such as poly(N-isopropylacrylamide) (PNIPAAm), structural analogs thereof, functional analogs thereof, copolymers thereof and combinations thereof; ionomers, such as poly(3,4-ethylenedioxythiophene) and polystyrene sulfonate, a mixture (PEDOT:PSS) thereof, structural analogs thereof, functional analogs thereof, copolymers thereof and combinations thereof.

In other embodiments, guest material may comprise a small molecule. As used herein, the term "small molecule" includes any low molecular weight compound. Typically, small molecules have a molecular weight of less than 900 Daltons and comprise a size on the order to $10^{-9}$ m. Examples of such small molecules include, but are not limited to, fullerenes, phthalocyanines, chromophores such as ruthenium dyes, ethyl violet dyes, and disperse red 1 dyes, quaternary ammonium salts (QAS) structural analogs thereof, functional analogs thereof, the like, and combinations thereof.

In other embodiments, guest material may comprise a nanoparticle. As used herein, the term "nanoparticle" refers to any nanoscale particle and may include, but is not limited to, the following: quantum dots, including solid or core/shell configurations of inorganic semiconductor materials (e.g., II-VI, III-V, IV-VI binary compounds, group IV materials, and combinations thereof), metallic nanoparticles (e.g., gold, silver, and combinations thereof), and metal oxide nanoparticles (e.g., zinc oxides, titanium oxides, and combinations thereof), nanowires, nanotubes, and the like.

In other embodiments, guest material may comprise a biologic. A biologic refers to any chemical compound or material that naturally occurs in an organism, is derived from an organism or is created by a biological process. Examples of a biologic include, but are not limited to, proteins, deoxyribonucleic acid (DNA), ribonucleic acid (RNA), complementary DNA (cDNA), oligopeptides, polypeptides, oligosaccharides, polysaccharides, lipids, proteins, other biologically-derived material, the like, and combinations thereof.

The host matrix can be selected to have the property that, when combined with the guest material to form a target emulsion and exposed to infrared energy, it absorbs some of the energy in such a manner such that the host matrix material is desorbed, thereby lifting or evaporating the guest material from the surface of the target emulsion. In some embodiments, only a thin layer on the surface of the target emulsion desorbs at any one time. The host matrix material may also be selected to be more volatile than the guest material and less likely than the guest material to adhere to the substrate. The choice of a particular host matrix material can depend on the choice of the guest material, and can be readily determined by one skilled in the art. Factors to be taken into consideration in selecting the host matrix material for a particular guest material include, but are not limited to, its ability to dissolve or form a colloidal or particulate suspension with the guest material, its melting point, heat capacity, molecular size, chemical composition, spectral absorption characteristics, heat of vaporization (factors that affect its ability to desorb and lift the coating material from the target) and its reactivity or nonreactivity towards the guest material.

In some embodiments, the host matrix may include, but is not limited to, the following compounds: aromatic compounds, such as toluene, xylene, mesitylene, chlorobenzene, dichlorobenzene, trichlorobenzene, tetrahydrofuran and combinations thereof; alcohols, such as methanol, ethanol, isopropanol, benzyl alcohol, and phenol; ketones, such as acetone and methyl ethyl ketone (MEK); and halo carbons, such as trichloroethylene and chloroform.

In accordance with embodiments of the present disclosure, a method of producing a film on a substrate includes combining a guest material, two or more host matrices, and a solvent having a hydroxyl (O—H) bond to form a target emulsion. One or more of the host matrices have the same or less volatility than one or more of the other host matrices. The method also includes exposing the target emulsion to an infrared source that is tuned to an absorption peak in the host matrix that is reduced in or absent from the guest material thereby desorbing the host matrix from the target emulsion and lifting the guest material from the surface of the target emulsion. The target emulsion and the substrate are oriented with respect to each other such that the lifted guest material is deposited as a film upon the substrate.

In such embodiments, one host matrix includes a compound capable of dissolving the guest material. Suitable compounds for this host matrix may include, but are not limited to, the following compounds: aromatic compounds, such as toluene, xylene, mesitylene, chlorobenzene, dichlorobenzene, trichlorobenzene, tetrahydrofuran and combinations thereof; alcohols, such as methanol, ethanol, isopropanol, benzyl alcohol, and phenol; ketones, such as acetone and methyl ethyl ketone (MEK); and halo carbons, such as trichloroethylene and chloroform.

Another host matrix can include a compound that provides hydroxyl (O—H) bonds for ablation and aids in the stabilization of the target emulsion through reduced volatility as compared with the other host matrix. An example compound includes an alcohol since alcohols require at least one O—H bond to be present and generally have higher boiling points and lower vapor pressures. Suitable alcohols include, but are not limited to, phenol, benzyl alcohol, methanol, ethanol, and isopropanol.

The guest material and host matrix (or matrices) may be combined in any manner to form a target emulsion that is suitable to carry out the methods of the present disclosure. In some embodiments, the guest material is soluble to some extent in the host matrix (or matrices) in which a target emulsion is formed. The target emulsion may then be frozen to form a solid target emulsion. The target emulsion may be kept frozen while the surface is being exposed to an infrared source during the method. Alternatively, should the guest material be not completely soluble in the host matrix (or matrices), the resulting target emulsion may includes a colloidal suspension of condensed phase.

In accordance with embodiments of the present disclosure, the steps of combining the guest material, host matrix, and solvent and exposing the target emulsion to an infrared source can be repeated to thereby create a multi-layer film on the substrate. In such embodiments, the target emulsion may be partitioned to accommodate multiple material solutions or emulsions such that the infrared source can address each target material region selectively and instantaneously in order to control in real time the material ratio in the deposited film.

The target emulsion may generally be in any shape suitable for being exposed to an infrared source. Suitable shapes may include, but are not limited to, a pellet, a disc, a cylinder, a parallelepiped, a ribbon, a sheet, and the like. In some embodiments, the target emulsion may comprise the shape of a disc or cylinder. For example, FIG. 1 illustrates a top view of an example slide of a target emulsion 100 having a disc shape with concentric rings in accordance with embodiments of the present disclosure. In this example, the target emulsion 100 may be partitioned into concentric rings in which each ring includes a single guest material. Referring to FIG. 1, blended polymer films with variable composition are deposited by resonant infrared, matrix-assisted pulsed laser evaporation. Particularly, for example, laser rasters along a line 102 while the target emulsion rotates about a center point 104. The target is partitioned into concentric rings as depicted by the light and dark portions of the target emulsion 100. The target may be split radially in this manner to set a variable volume ratio, and therefore variable composition of blended polymer films during growth. For example, if the deposition rate across the entire target is 1, then a volume ratio can be set by dwelling for the same values in time. A 3:1 volume ratio may be set by dwelling with the laser 3 times longer in the first material. Conversely, the raster rate may be set in the first material for ⅓ the linear speed of the second material. However, if the deposition rate in the center lighter portion is 2 times that of the outer darker portion, then this can be accounted for to determine the correct time ratio needed to produce a given layer.

In accordance with embodiments, the laser spatial position along line 102 is defined in the software by the number of "counts" that a motor travels to adjust the mirror that positions the laser beam. The radial raster velocity is another programmable parameters in units of "counts/second". The linear velocity, v, along the raster line increases with the radius r, as indicated in the example of FIG. 1. The raster rate can be slowed as r increases to ablate the target evenly. For simplicity in one example, no such adjustment may be made to compensate for this effect initially. Instead, an average deposition rate was determined for a fixed radial range. This change in linear velocity may also be taken into account.

FIG. 2 illustrates a side view of the example slide of the target emulsion 100 shown in FIG. 1. Referring to FIG. 2, a laser 200 generates an Er:YAG laser beam 202 and directs the laser beam 202 towards the target emulsion 100. The geometry of the MAPLE target 100, laser 200, and substrate (not shown) leads to a position dependence in incident laser angle, delivered energy density, and deposition rate. FIG. 2 demonstrates these effects. As a note, the substrate can be positioned above and parallel to the target, or in any other suitable position. The laser spot geometry, as depicted, although elliptical, is more circular at the center of the target, giving a higher energy density and a higher deposition rate. The center rate can range from about 1.5 to 4 times the annulus deposition rate, depending primarily on the target composition.

Figure 4:
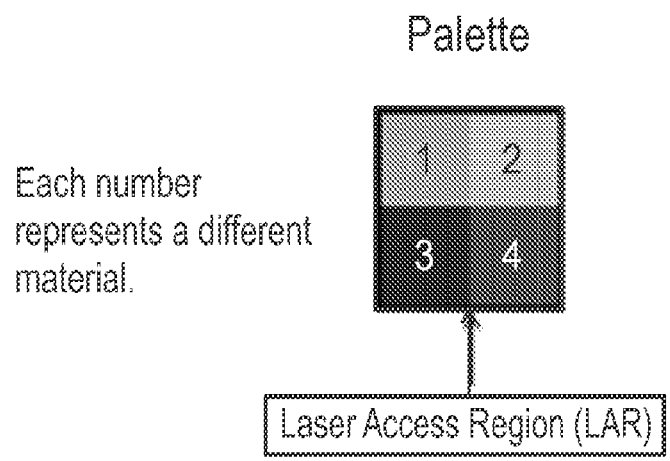

In other embodiments, the target emulsion can be in the shape of a ribbon or sheet. Further, the target emulsion may be partitioned into linear adjacent, parallel, non-overlapping regions. In certain embodiments, each region comprises a single guest material. In yet another embodiment, and as shown in FIGS. 3 and 4, an example target emulsion is illustrated as being partitioned into a compact series of squares or rectangular non-overlapping regions that are organized in a row and column pattern.

An apparatus, or system comprising an apparatus for carrying out the steps of the present disclosure may include any conventional apparatus capable of depositing a film using infrared energy, such as those used for resonant-infrared matrix-assisted pulsed laser evaporation (RIR-MAPLE).

The target emulsion may be mounted by any support technique or mechanism. The angle of incidence between the source of infrared energy and the target emulsion plane can be any suitable angle used in the art. In some embodiments, the angle is about 60°. Typically, the target emulsion is mounted on a moving support mechanism. For example, for target emulsions comprising a disc or other circular/elliptical shape, the support mechanism may include a shaft that rotates and/or translates, such that different portions of the target are in the center of the infrared energy beam at different times, thereby extending the useful lifetime of the target emulsion and providing enhanced film uniformity. In some embodiments, the target emulsion is rotated at a speed of about 0.1 to about 20 rev/s. In some embodiments, the rotation speed comprises about 0.2 to about 15 revs/s. In yet other embodiments, the rotation speed comprises about 4-12 revs/s. Such an arrangement allows for greater uniformity of deposition on the substrate. In addition to (or instead of) moving the target, the center of the laser beam can be moved to achieve similar effects. Larger substrate areas may be coated by rastering the center of the laser beam across the target surface. In these cases, targets having diameters>0.75 inch may be used.

Any energy source capable of generating a wavelength that is resonant with hydroxyl (O—H) bonds may be used in the present disclosure (see, e.g., Example 2 herein). In some embodiments, the energy source comprises an infrared source that is capable of generating wavelengths that are resonant with hydroxyl (O—H) bonds. In some embodiments, the infrared source comprises a wavelength of at least 0.7 μm and up to and including 1000 μm. In some embodiments, the wavelength comprises at least 1 μm to about 10 μm. In other embodiments, the wavelength comprises at least 1.06 μm to about 6 μm. In yet other embodiments, the wavelength comprises at least 2.7 μm to about 3.4 μm. In some other embodiments, the wavelength comprises at least 2.82 μm to about 3.1 μm.

In some embodiments, the infrared source comprises a laser. In general, and as discussed below, a pulsed laser, particularly a short pulsed laser, may be used. Examples of such lasers include, but are not limited to, an excimer laser (e.g., ArF, KrF, XeF, or XeCl) or other short pulsed lasers, such as Er:YAG, Nd:YAG or $CO_2$ may be used. In some embodiments, the laser comprises an Er:YAG laser. Lasers for use in accordance with the present disclosure generally emit a wavelength in the range of about 1.5 μm to about 3.5 μm, an energy density of about 0.05 to 10 $J/cm^2$, a pulse width of about $10^{-12}$ to $10^{-5}$ seconds and a pulse repetition frequency of about 0 to 1000 Hz.

The distance between a target emulsion and a substrate can be within any suitable range. For example, the distance can be between about 3 cm and about 10 cm. In another example, the distance between the target emulsion and the substrate can be between about 4 cm and about 7 cm. In another example, the distance can be about 7 cm. In general, greater distances are more suitable for depositing on larger substrate areas. Distances of greater than 10 cm may be used if desired, for example, for depositing on larger surface areas. However, the target-substrate distance is also inversely related to the film thickness and lateral uniformity achieved for a given period of deposition. The substrate may be manipulated, such as by rotation or translation, during deposition to allow deposition on non-planar or irregularly shaped surfaces. If the guest material used in the practice of the disclosure is a polymer, a more uniform coating may be created by heating the substrate to a temperature above the glass transition or melting point of the polymer while the coating material is being deposited on the substrate.

The target emulsion and the substrate may be positioned within an enclosed space or chamber, e.g., a deposition chamber, that has an environment whose temperature, pressure and chemical composition can be controlled to enhance the deposition process and to minimize the likelihood of damage to the guest material. Suitable environments according to embodiments of the present disclosure may include nitrogen, argon, other non-reactive or inert gases, or a mixture of these gases, which pass directly into a vacuum chamber via a gas inlet port. If desired, the chamber atmosphere may be changed at the end of a deposition process to bring the substrate to atmospheric conditions. Gases present before and during the deposition process may be referred to as "make-up gases." The gases introduced into the chamber at the end of deposition may be referred to as "quenching gases."

Figure 5:
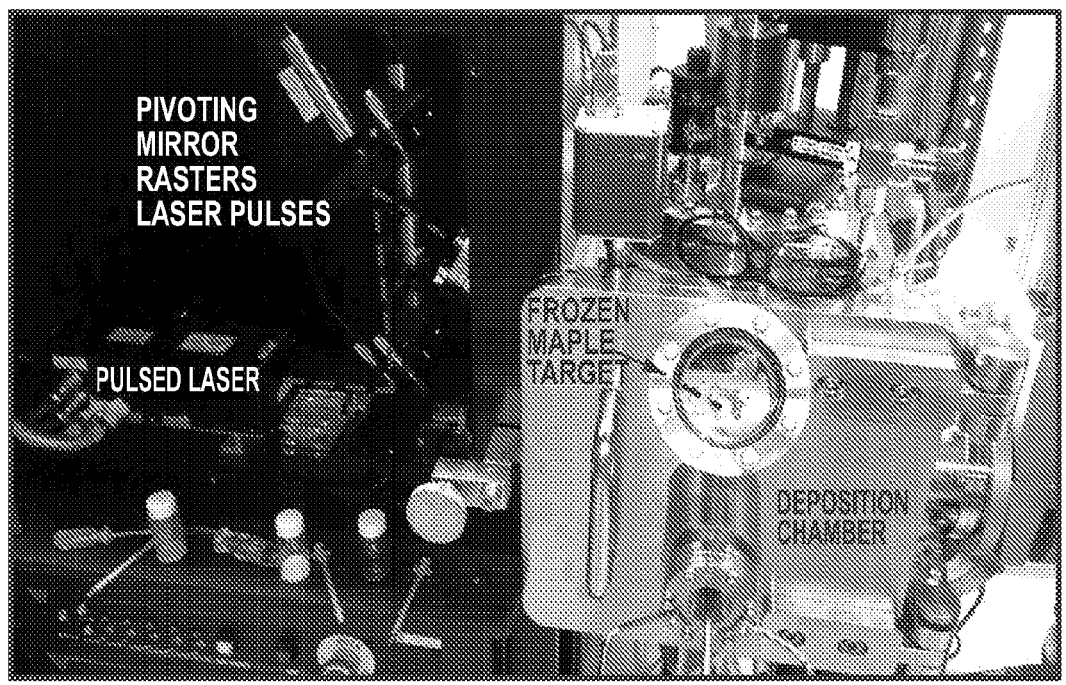
FIG. 5 is an image of an example deposition chamber and pulsed laser components of an apparatus in accordance with embodiments of the present disclosure.
Figure 6:
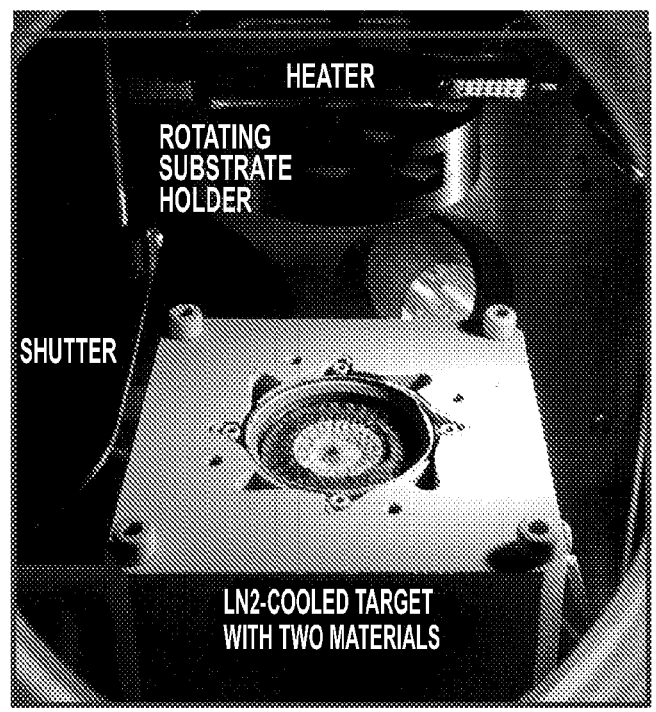
FIG. 6 is an image of an example rotating substrate holder of an apparatus in accordance with embodiments of present disclosure.

FIG. 5 is an image of an example deposition chamber and pulsed laser components of an apparatus in accordance with embodiments of the present disclosure. FIG. 6 is an image of an example rotating substrate holder of an apparatus in accordance with embodiments of present disclosure. In these embodiments, the apparatus includes a pulsed laser, one or more pivoting mirrors to raster the laser, and a deposition chamber. The deposition chamber may include a heater, shutter, and a rotating substrate holder.

The background pressure within the deposition chamber during deposition can determine the rate at which the film of guest material is deposited on the substrate. Generally, the lower the pressure, the faster the deposition. As the pressure within the chamber increases, the number of collisions between the ablated guest material and the gas increases. These collisions slow the deposition process, resulting in thinner films. Generally, the background pressure within the chamber during a deposition may be between about 1E-7 Torr and about 760 Torr. In examples, deposition is performed below atmospheric pressure. In some embodiments, the total pressure within the chamber during deposition is between about 1E-6 Torr to about 1 Torr. In yet other embodiments, the range is between about 1E-5 Torr and about 1E-3 Torr.

In accordance with embodiments, the thickness of the deposited film can proportional to the number of laser pulses to which the target emulsion is exposed and, consequently, to the time of deposition for a given laser pulse rate, which is given by the sum of the $t_d$ values set forth in the following equations. The film thickness may be selected, for example, by controlling the number of laser pulses depending on the purpose for which the finished article is to be used. The thickness of the film may also be controlled by selecting factors such as the laser energy density, the target temperature and the distance of the substrate from the target. The following equations represent the relationship of variables.

$$t_{d1} = \frac{f_1 d}{r_{d1}}$$

$$t_{d2} = \frac{f_2 d}{r_{d2}}$$

$$t_{total} = t_{d1} + t_{d2}$$

$$TR = \begin{cases} t_{d1}/t_{d2}:1, t_{d1} > t_{d2} \\ 1:t_{d2}/t_{d1}, t_{d1} < t_{d2} \end{cases}$$

$$v_1 = \frac{2c_1}{t_{min} TR_1}$$

$$v_2 = \frac{2c_2}{t_{min} TR_2}$$

$t_d$: deposition time of materials
f: volume fraction
d: total layer thickness of mixed polymer layer
rd: deposition rate (determined experimentally using a 30-min. calibration growth and AFM to measure the thickness)
TR: time ratio, ratio of time spent in each material
$t_{total}$: total deposition time, determined by the total layer thickness
v: radial raster velocity
$c_n$: count range in material n
$t_{min}$: 3 sec., minimum time in given material to account for pulsed laser at 2 Hz The layer thickness can determine the total deposition time requires, which is given by the sum of the $t_d$ values. In an example, the laser may be pulsed at 2 Hz, so there may be a minimum time that must be set that corresponds to the minority material (i.e., a value of 1 in the time ratio) so that nonzero ablation occurs in the minority material. The factor of 2 comes from the fact that each material count range can be traversed in both directions, increasing and decreasing radius, for a single raster pass.

In an example, a calculation for a 1:3, 20-nm thick layer follows.

Polymer 1: 25% by volume, 0.6 nm/min dep rate, 17,000 count range
Polymer 1: 75% by volume, 0.4 nm/min dep rate, 4,000 count range $$t_{d1} = \frac{(0.25)(20 \text{ nm})}{(0.6 \text{ nm/min})} = 8:20 \text{ (mm:ss)}$$

$$t_{d2} = \frac{(0.75)(20 \text{ nm})}{(0.4 \text{ nm/min})} = 37:30 \text{ (mm:ss)}$$

$$t_{total} = 45:50 \text{ (mm:ss)}$$

$$TR = 1:4.5$$

$$v_1 = \frac{2(17000 \text{ counts})}{(3 \text{ sec})(1)} = 11333 \text{ counts/sec}$$

$$v_2 = \frac{2(4000 \text{ counts})}{(3 \text{ sec})(4.5)} = 593 \text{ counts/sec}$$

FIG. 7 are images of results obtained for RIR-MAPLE thin-film deposition of a polymer blend including the diblock copolymers and homopolymers polystyrene (PS) or poly(methyl methacrylate) (PMMA) for application to optical AR coatings. The refractive index (RI) may be varied by co-depositing polymer blends with varying composition and then selectively dissolving the PMMA component with glacial acetic acid to yield a PS film containing air pores.

Effective medium theory dictates that the combinations of the pores and the PS can yield a film having a RI between those of the two components separately.

Figure 8:
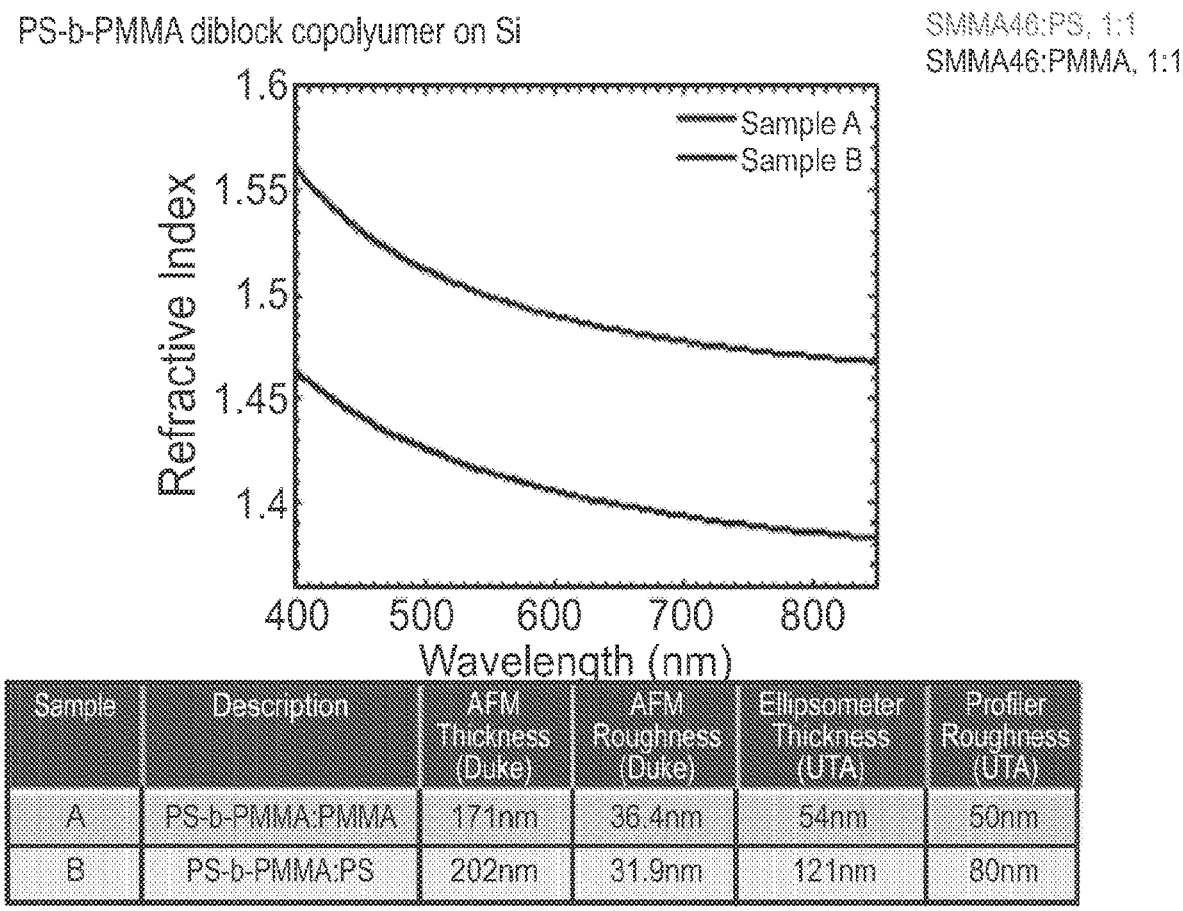
FIG. 8 depicts a graph showing refractive index versus wavelength for 1:1 (by volume) blends of PS-b-PMMA diblock copolymer with PS and with PMMA.

FIG. 8 depicts a graph showing refractive index versus wavelength for PS-b-PMMA diblock copolymer deposited in a 1:1 volume ratio with the homopolymer PS and with the homopolymer PMMA. After the PMMA component is chemically removed, the resultant films have differing amounts of PS remaining and have air pores replacing the PMMA. Due to nanoscale domain sizes, the PS/air blends act as effective media that exhibit RIs proportional to the PS:air volume ratio. Sample A has a higher ratio of air pores, and thus, a lower RI. Sample B has the most PS remaining, but still has air pores; thus, the RI is near that of bulk PS alone, yet slightly reduced due to the air pores present. Therefore, the homopolymer/copolymer blends of different ratios deposited using techniques in accordance with embodiments of the present disclosure demonstrate the correct trend in measured RI.

FIG. 9 depicts an example of a gradient refractive index film in accordance with embodiments of the present disclosure. This example demonstrates a gradient refractive index film for application to anti-reflective (AR) coatings. The deposition uses 4 targets of two materials each to build the different RI regimes. The composition of materials can be varied using their growth rate to determine the raster pattern. In this example, theoretical RI matches desired RI by varying materials composition in the manner shown in the example. Two prototypes were produced. In one prototype, a GRIN sample having 10 nm slices of varying ratio were produced to make up a 1 μm thick film using 4 targets that mix 5 materials in pairs: PS, SMMA30, SMMA46, SMMA69, and PMMA (the number indicates volume fraction of MMA component). In another prototype, a GRIN sample had 20 nm slices to improve contiguousness of slices within film. Also, the MAPLE target was refreshed after initial surfaces were eroded.

In accordance with embodiments of the present disclosure, FIG. 10 depicts images shows a sequence of example target ablation progression during one of the depositions for the GRIN film.

Figure 11:
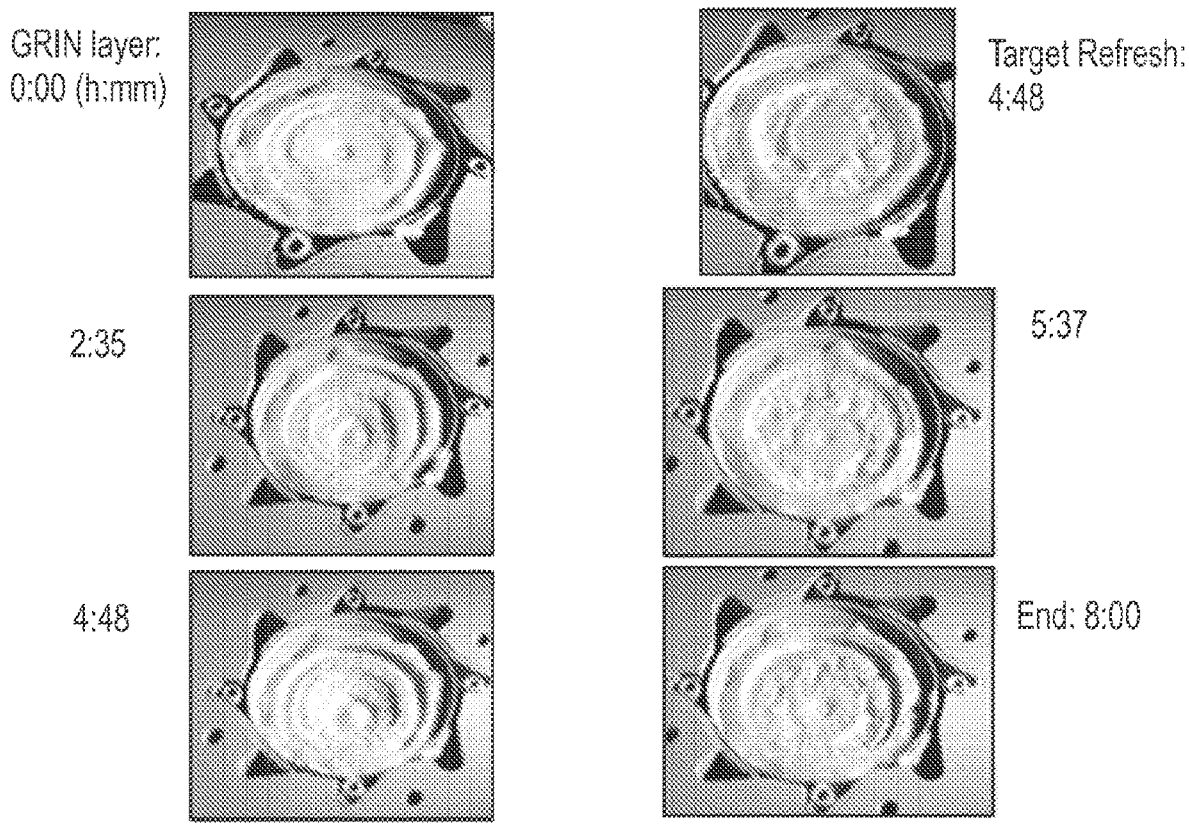
FIG. 11 depicts images shows a sequence of another example target ablation progression during one of the depositions for the GRIN film in accordance with embodiments of the present disclosure.

FIG. 11 depicts images shows a sequence of another example target ablation progression during one of the depositions for the GRIN film in accordance with embodiments of the present disclosure.

Figure 12:
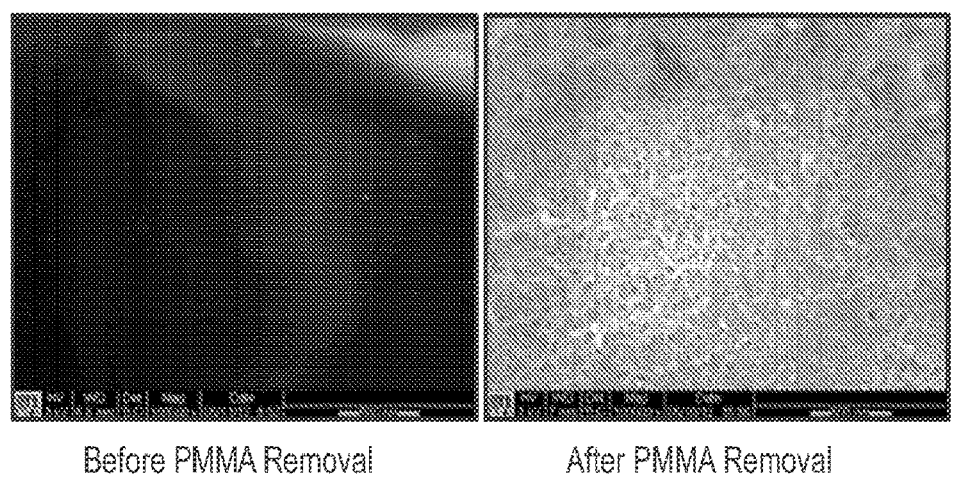
FIGS. 12-14 depict scanning electron microscopy (SEM) images of GRIN film deposited by RIR-MAPLE in accordance with embodiments of the present disclosure.
Figure 13:
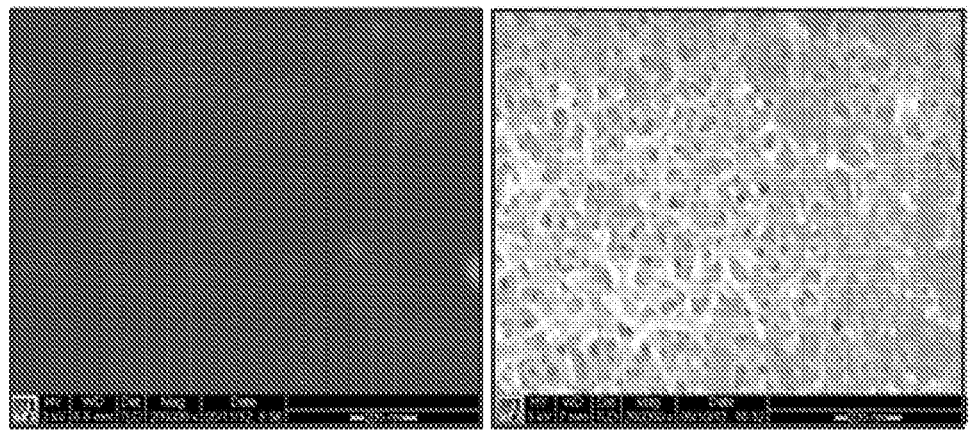
Figure 14:
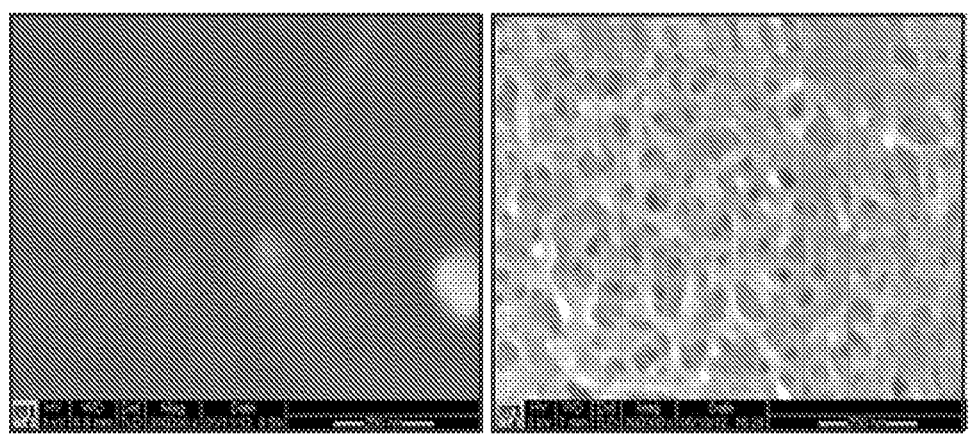

FIGS. 12-14 depict scanning electron microscopy (SEM) images of GRIN film deposited by RIR-MAPLE in accordance with embodiments of the present disclosure. The left image of each figure shows the film before PMMA removal. The right image of each figure shows the film after PMMA removal.

Figure 15:
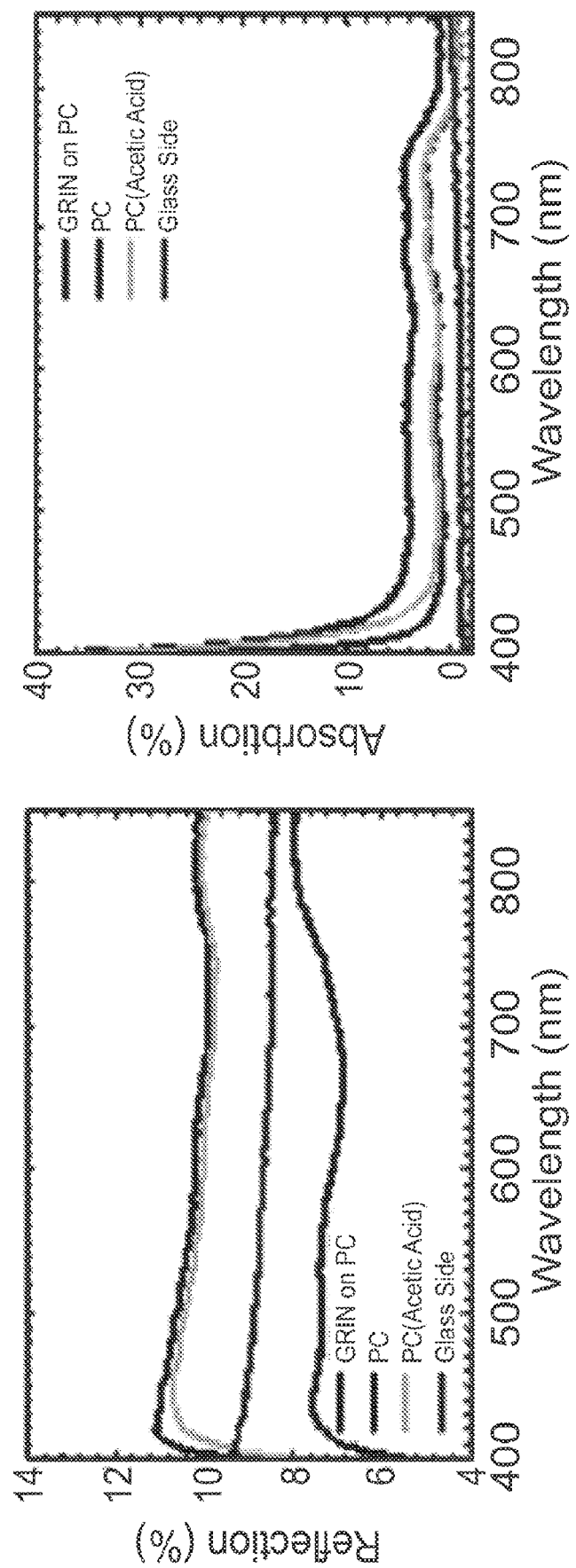
FIG. 15 depicts graphs of reflection (left) and absorption (right) versus wavelength.

FIG. 15 depicts graphs of reflection (left) and absorption (right) versus wavelength. There is a reduction from 12% to 8% of R across the visible spectrum.

Figure 16:
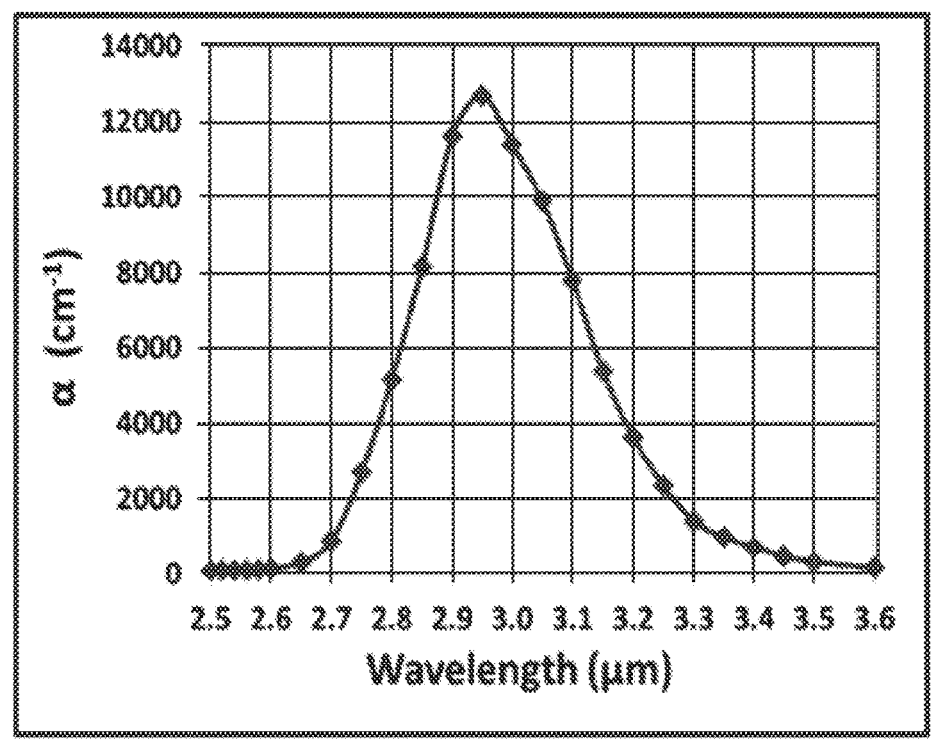
FIG. 16 depicts a graph of water absorption coefficient—absorption ranges of approximately 2.7-3.4 μm.

FIG. 16 depicts a graph of water absorption coefficient—absorption ranges of approximately 2.7-3.4 μm.

Figure 17:
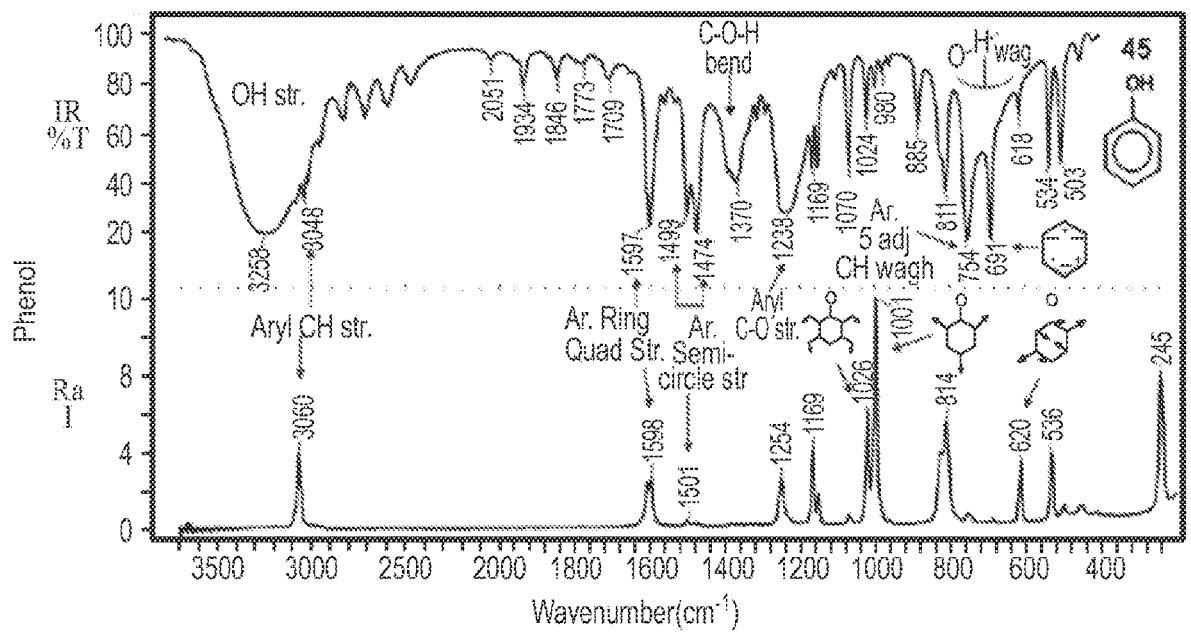
FIG. 17 depicts a graph of phenol FTIR spectrum—OH stretch ranges between about 3700-2940 $cm^{-1}$ (2.7-3.4 μm)

FIG. 17 depicts a graph of phenol FTIR spectrum—OH stretch ranges between about 3700-2940 $cm^{-1}$ (2.7-3.4 μm).

Figure 18:
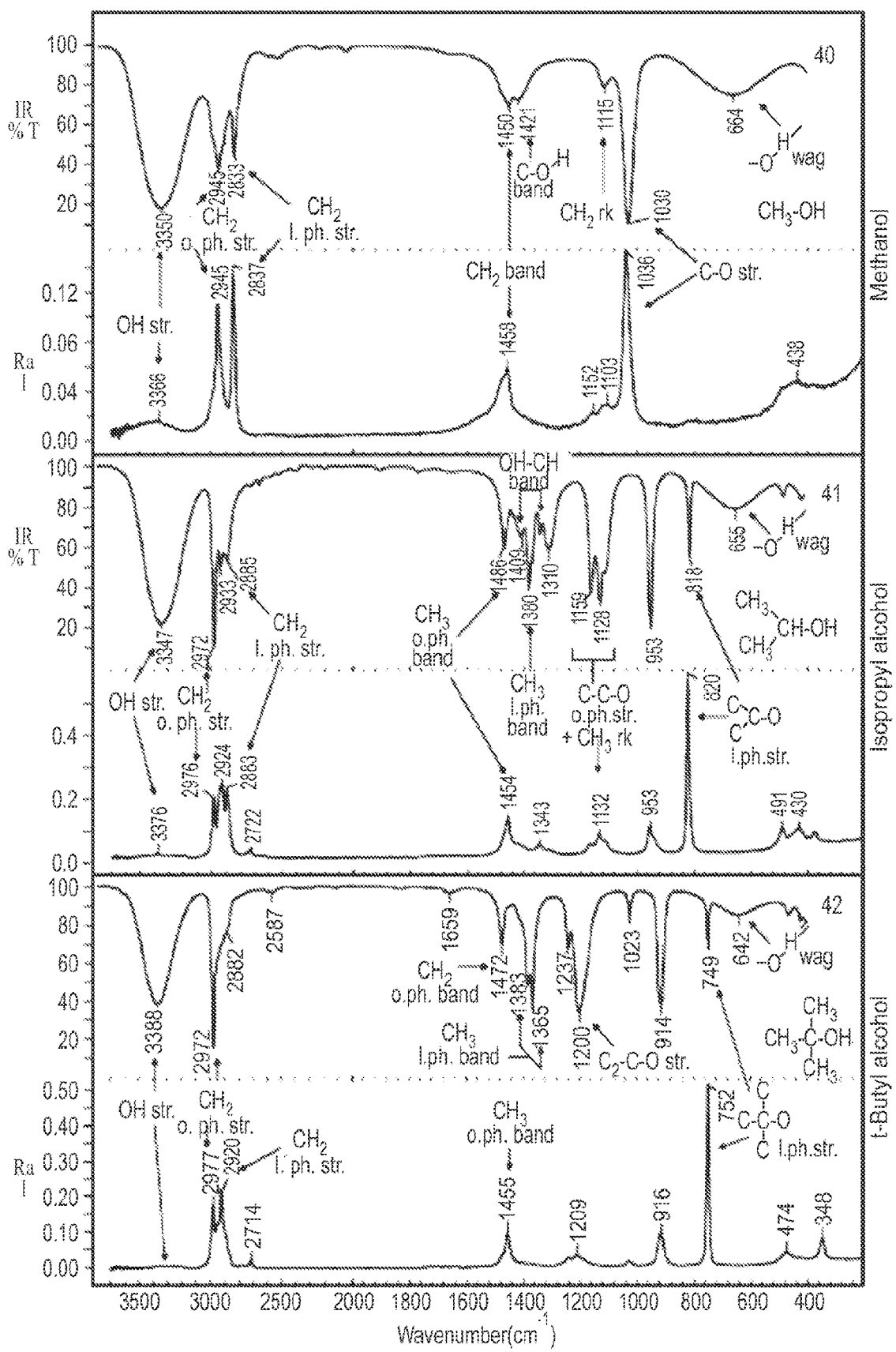
FIG. 18 depicts graphs of example alcolohols—FTIR spectra showing OH stretch ranges similar to water and phenol.

FIG. 18 depicts graphs of example alcolohols—FTIR spectra showing OH stretch ranges similar to water and phenol.

Figure 19:
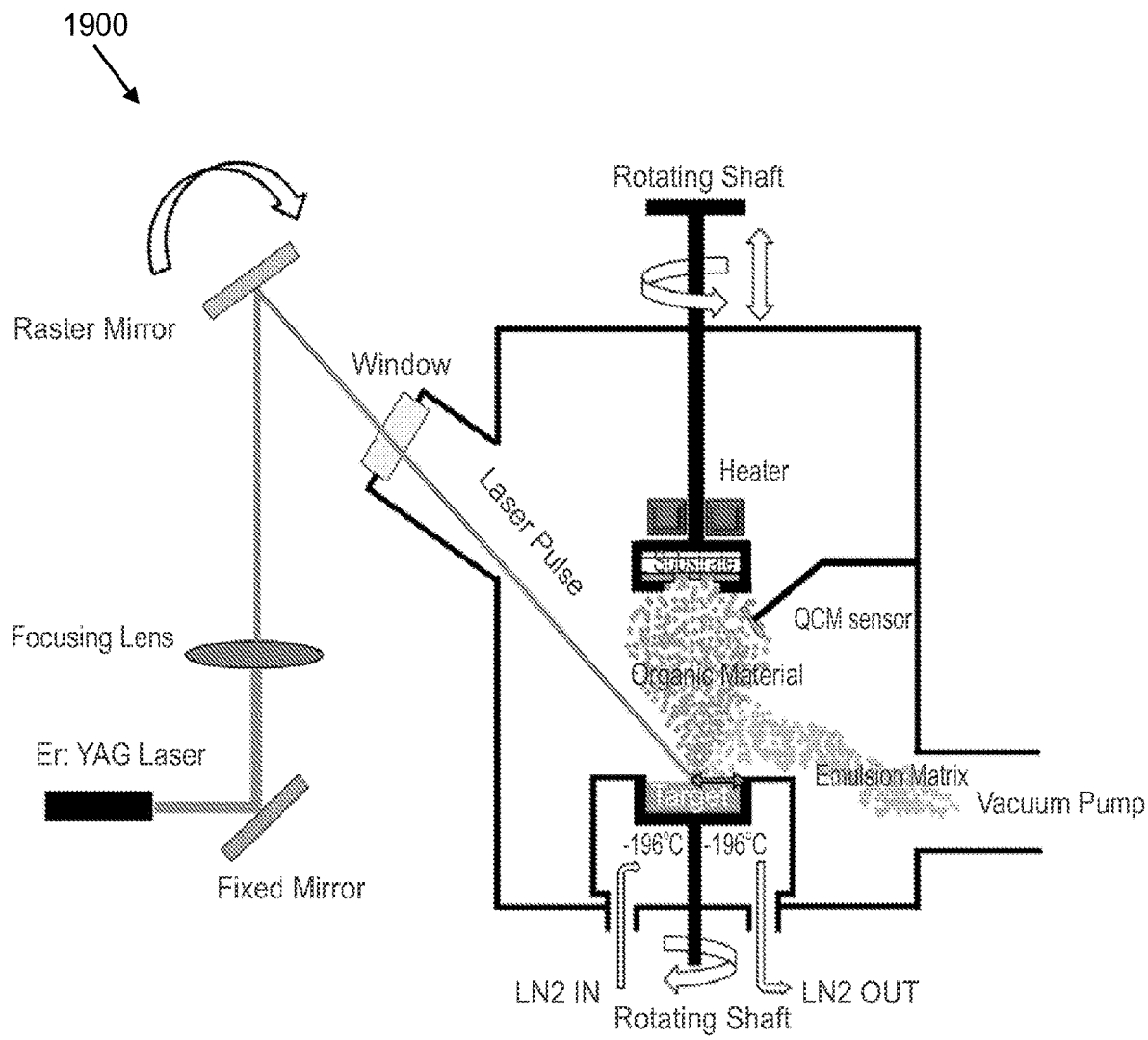
FIG. 19 is a schematic diagram of an example system for deposition of films in accordance with embodiments of the present disclosure.

FIG. 19 illustrates a schematic diagram of an example system 1900 for deposition of films in accordance with embodiments of the present disclosure. In particular, the system 2000 may be used in a MAPLE technique for depositing thin films. Referring to FIG. 19, an incident infrared laser (Er:YAG) pulse ablates a solid frozen target in a high vacuum chamber. The frozen target consists of a guest material and the hydroxyl-rich host matrix. When the laser pulse ablates the frozen target, the host matrix absorbs most of the energy, creating a plume comprising the guest material and gasified water and organic solvent. While most of the gasified water and organic solvent is pumped away, the guest material, which usually has a high sticking coefficient, is deposited onto the substrate as a thin film.

In emulsion-based RIR-MAPLE, instead of a UV laser, a lower energy infrared laser, such as an Er:YAG laser (~2.94 μm), can be used to ablate the polymer target. In addition, given that the frequency of the Er:YAG laser is resonant with OH bond vibrational modes in water, a frozen emulsion (comprising a mixture of the guest material dissolved in an organic solvent and water) is used as the target for laser ablation. Therefore, the unique advantage of emulsion-based RIR-MAPLE is that most of the energy from the IR laser is absorbed by the water in the emulsion, leaving the organic guest material to be gently deposited onto the substrate with minimal solvent exposure and without significant degradation. Using this emulsion-based RIR-MAPLE deposition, a bulk heterojunction organic solar cell based on the PCP-DTBT/$PC_{71}$BM (phenyl-C71-butyric acid methyl ester) system was demonstrated in 2014 with a much higher PCE, up to 0.86%, compared to the previously reported organic solar cells fabricated by UV-MAPLE. This milestone demonstrates that the stated advantages of emulsion-based RIR-MAPLE translate into tangible and significant improvements in organic solar cell device performance, and that this technique should be investigated further in order to better understand the structure-property-performance relationships that exist.

In an example process of RIR-MAPLE deposition, the emulsion containing the guest material to be deposited and the matrix solvents can be flash frozen in a rotating, liquid nitrogen-cooled target cup. The substrate on which the film to be deposited is located facing the target cup in a rotating holder. The pulsed laser may be focused and rastered across the target via inline optics. The laser pulses may be absorbed by the frozen target, which is locally vaporized. The vapor can include the guest material and the matrix solvents. The solvents are generally much smaller and lower in mass than the guest material and are pumped away by the vacuum system. The remaining guest material is deposited onto the substrate.

Figure 20:
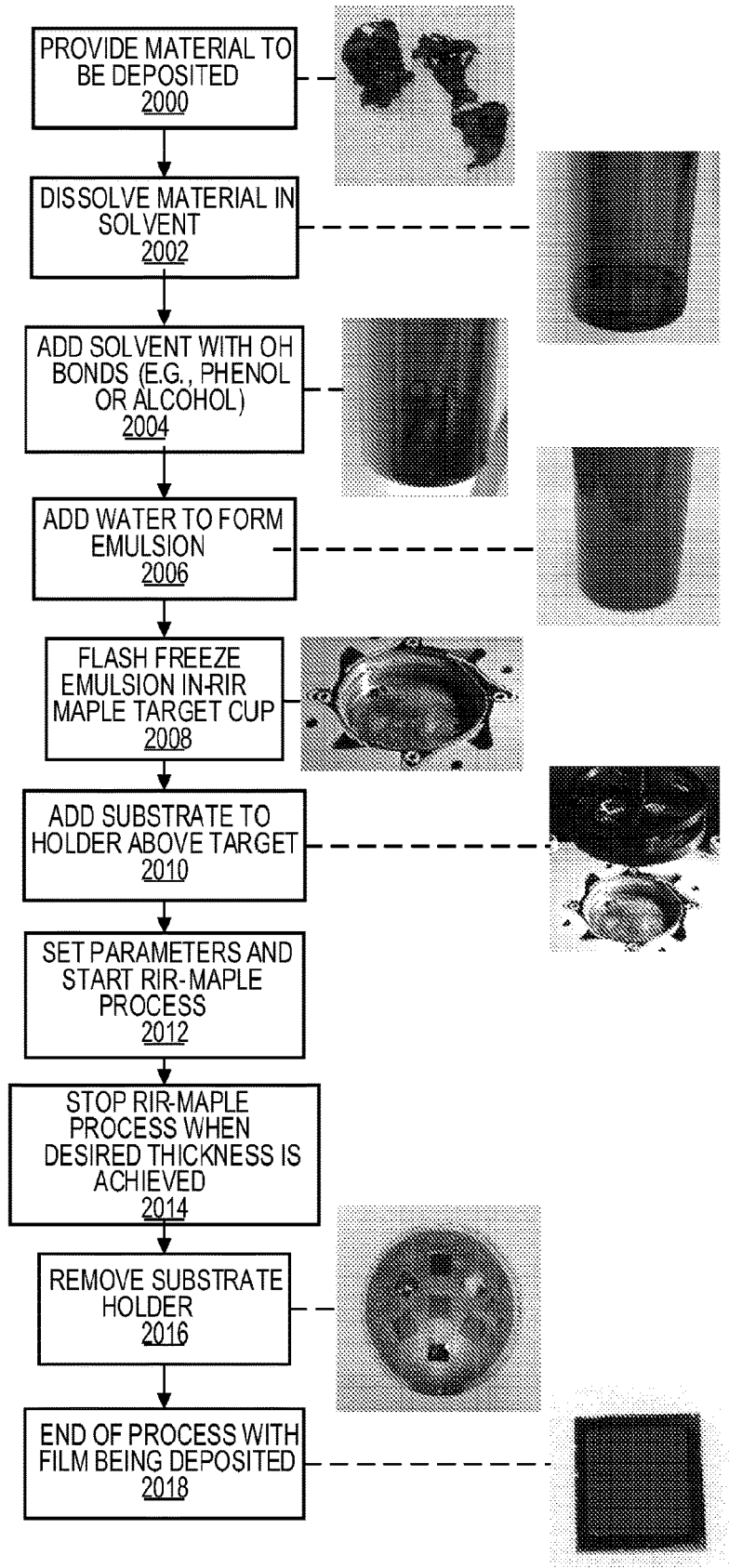
FIG. 20 illustrates a flowchart of an example method and associated images for depositing film in accordance with embodiments of the present disclosure.

FIG. 20 illustrates a flowchart of an example method and associated images for depositing film in accordance with embodiments of the present disclosure. As shown, the figure includes several blocks associated with steps in the process. Images depicting steps in the method are associated with particular blocks. An image is shown as being associated with a particular block by connection with a broken line. The method may be implemented with any suitable system, such as the system 1900 shown in FIG. 19.

Referring to FIG. 20, the method includes providing 2000 material to be deposited. The associated image shows the material used in one experiment. For example, the material may be a suitable polymer or nanoparticle. Subsequently, the method includes dissolving 2002 material in solvent. Any suitable solvent may be utilized, such as the exemplary solvents identified herein. The associated image shows the material dissolving in solvent.

The method of FIG. 20 includes adding 2004 solvent with OH bonds. The solvent may be, for example, phenol or alcohol). The method also includes adding 2016 water to form an emulsion. The associated images show the result of adding the solvent and water.

The method of FIG. 20 includes flash freezing 2008 the emulsion in an RIR-MAPLE target cup. The associated image shows emulsion in a target cup.

Subsequently, the method of FIG. 20 includes adding 2010 substrate to the holder above the target. The associated image shows this step. The method also includes setting 2012 parameters to start the RIR-MAPLE process. The method also includes stopping 2014 the RIR-MAPLE process when a desired thickness is achieved. Further, the method includes removing 2016 the substrate holder, and the process ending 2018 with the film being deposited.

Figure 21:
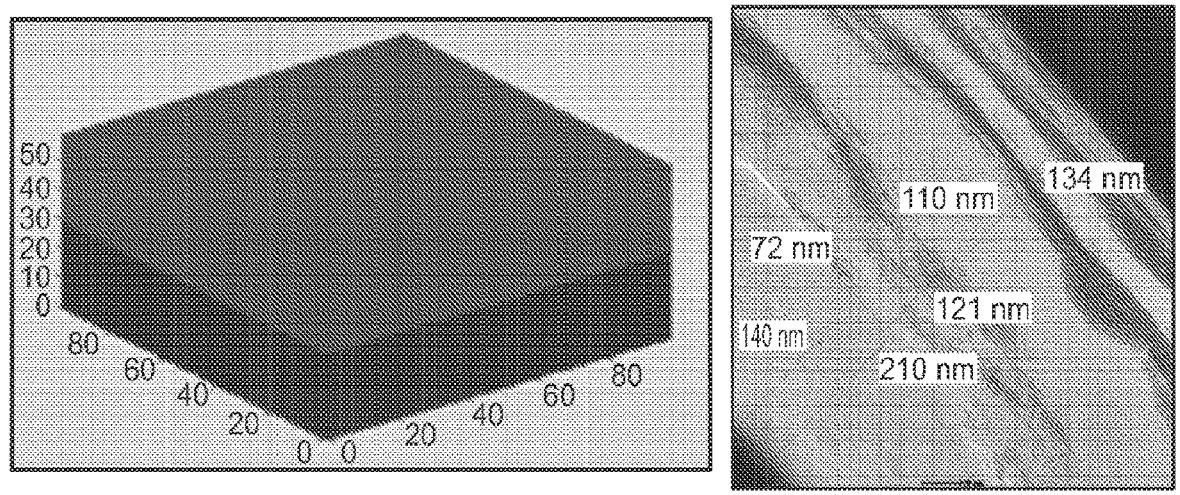
FIGS. 21, 22, and 23 are various images of films deposited in accordance with embodiments of the present disclosure.
Figure 22:
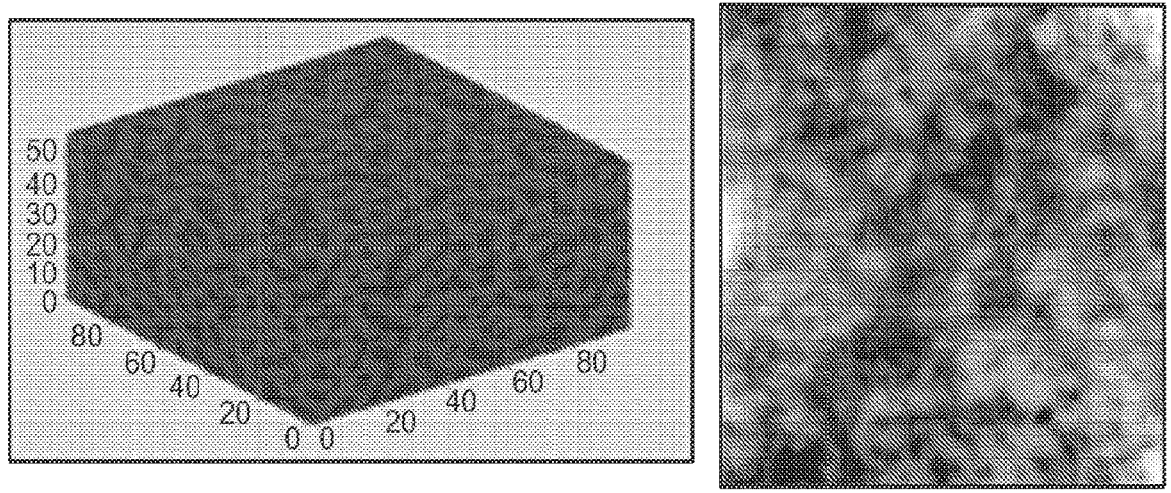
Figure 23:
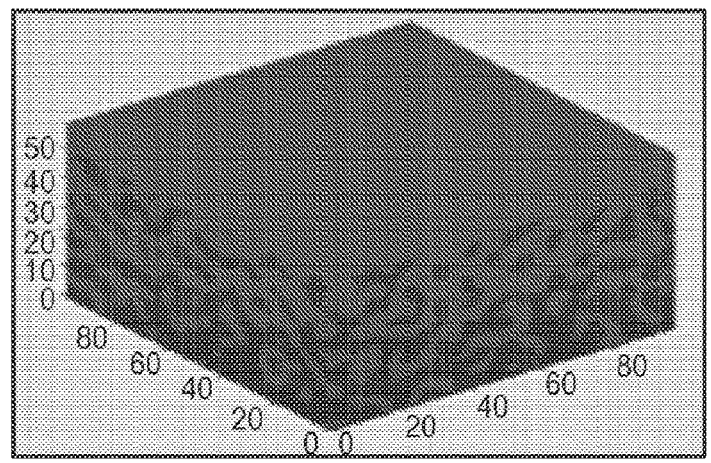

FIGS. 21, 22, and 23 illustrate various images of resultant films deposited in accordance with embodiments of the present disclosure. Referring to FIG. 21, the left image shows a layered film resulting from alternating the laser pulses between two or more target materials at fixed intervals, A composite film having alternating layers is produced. Laser pulses can be applied to different materials of the target emulsion, the laser pulses being spatially alternated between the different materials for determining the structure of a resulting mixed composition film. Particularly, one homogeneous material layer atop another homogeneous layer in a single deposition session may be produced. The right image of FIG. 21 shows a cross-section TEM image of the layers. The laser pulses can be timed for determining the structure of the resulting mixed composition film.

Now referring to FIG. 22, the left image shows a nanoscale blend, also known as a bulk heterojunction (BHJ), and the right image shows an energy-filtered, planar transmission electron microscope (TEM) image of nanoscale domains in a bulk heterojunction structure. Light regions are one material, and dark regions are a different material. The structure can be achieved by rapidly alternating applied pulses among two or more different materials to produce a blended composite film. In an example, the spatial extent of each material domain can be about 1 micrometer or less in size within the film.

Referring to FIG. 23, the image shows a gradient structure in which the ratio of two materials is changed over the course of a deposition session from 100% of the first material at the start of the session to 100% of the second material near the end of the session. In accordance with embodiments, this structure can be achieved by actively controlling laser pulse timing between two or more materials to produce the composite film.

Figure 24:
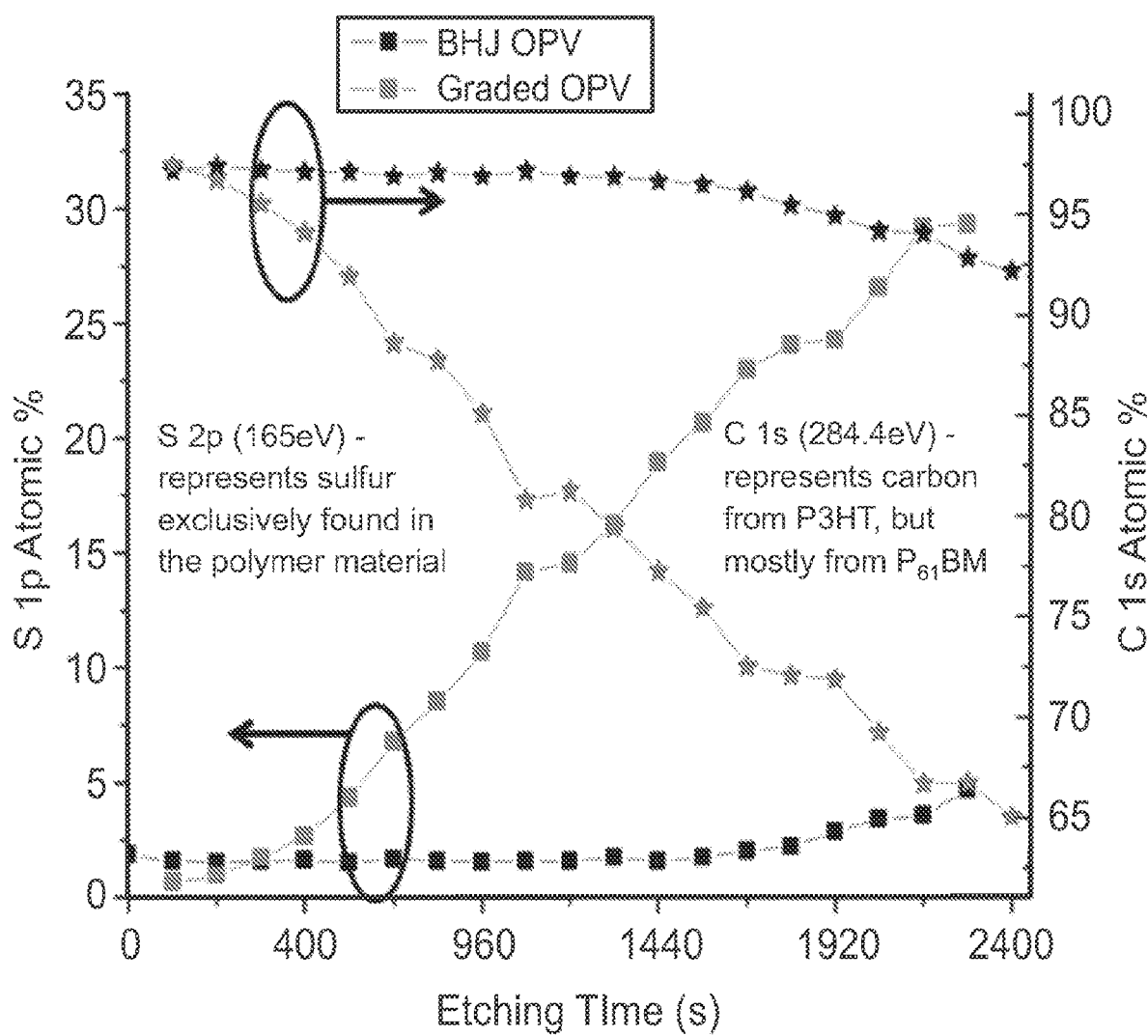
FIG. 24 is a graph showing x-ray photoelectron spectroscopy (XPS) data of two different film structures created in accordance with embodiments of the present disclosure.

FIG. 24 is a graph showing x-ray photoelectron spectroscopy (XPS) data demonstrating two different film structures created in accordance with embodiments of the present disclosure. The data demonstrate the relative amounts of two different materials (i.e. S 2p in the polymer P3HT versus C 1s in the small molecule $PC_{61}BM$) versus depth (i.e. etching time) within both a constant ratio film and within a gradient ratio film. The left vertical axis represents an S 2p atomic percentage which is indicative of the volume of the polymer P3HT present in the film. The right vertical axis represents the C 1s atomic percentage, which is indicative of the volume of the small molecule $PC_{61}BM$ present in the film. The x-axis is the etching time vertically through the axis normal to the plane of the film and represents the depth within the film. The black symbols represent the film of FIG. 22, which has a constant ratio of two materials throughout the film. The grey symbols represent the film of FIG. 23 in which the ratio of two materials is slowly changed from 100% of the first material at the beginning of the deposition session to 100% of the second material near the end of the deposition session.

It is noted that a laser or other source as described herein can be controlled by a suitable computing device, such as a desktop or laptop computer, for implementing the steps or functions described herein. The computing device may includes hardware, software, and/or firmware for implementing the steps and functionality. For example, computer program product may reside in memory and one or more processors may implement code for implementing steps and functionality in accordance with embodiments of the present disclosure.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Any patents or publications mentioned in this specification are indicative of the levels of those skilled in the art to which the present subject matter pertains. These patents and publications are herein incorporated by reference to the same extent as if each individual publication was specifically and individually indicated to be incorporated by reference.

One skilled in the art will readily appreciate that the present subject matter is well adapted to carry out the objects and obtain the ends and advantages mentioned, as well as those inherent therein. The present examples along with the methods described herein are presently representative of various embodiments, are exemplary, and are not intended as limitations on the scope of the present subject matter. Changes therein and other uses will occur to those skilled in the art which are encompassed within the spirit of the present subject matter as defined by the scope of the claims.

What is claimed:

1. A method of producing a film on a substrate, the method comprising:
    combining a guest material, a host matrix, and a solvent having one or more hydroxyl (O—H) bonds to form a target emulsion; and
    exposing the target emulsion to an infrared source that is tuned to an absorption peak in the host matrix that is reduced in or absent from the guest material thereby desorbing the host matrix from the target emulsion and lifting the guest material from the surface of the target emulsion, the target emulsion and the substrate being oriented with respect to each other such that the lifted guest material is deposited as a film upon the substrate, and
    wherein the target emulsion is partitioned into concentric rings, wherein each ring comprises a single guest material.

2. The method of claim 1, wherein combining the guest material, host matrix, and solvent comprises dissolving the guest material in the host matrix.

3. The method of claim 2, wherein the host matrix is more volatile than the guest material.

4. The method of claim 1, wherein exposing the host matrix in the target emulsion to the infrared source excites specific molecular vibrational bond stretches that reduce degradation of the guest material.

5. The method of claim 1, wherein the infrared source comprises a wavelength that is resonant with hydroxyl (O—H) bonds.

6. The method of claim 5, wherein the wavelength comprises a range of about 2.7 μm to about 3.4 μm.

7. The method of claim 5, wherein the wavelength comprises a range of about 2.82 μm to about 3.1 μm.

8. The method of claim 1, wherein the infrared source comprises a laser.

9. The method of claim 8, wherein the laser comprises an Er:YAG laser.

10. The method of claim 1, wherein the guest material comprises one of a polymer, a small molecule, a nanoparticle, a biologic, and combinations thereof.

11. The method of claim 10, wherein the polymer comprises one of a linear conjugated polymer, a linear nonconjugated polymer, a polyelectrolyte, a stimuli-responsive polymer, an ionomer, and combinations thereof.

12. The method of claim 11, wherein the linear conjugated polymer comprises one of polythiophene (PT), poly(p-phenylene vinylene) (PPV), polypyrrole (PPY), polyaniline (PANI), polyacetylene, polyparaphenylene (PPP), copolymers thereof and combinations thereof.

13. The method of claim 11, wherein the linear nonconjugated polymer comprises one of polyacrylates, polystyrenes, copolymers thereof and combinations thereof.

14. The method of claim 11, wherein the polyelectrolyte comprises one of poly(phenylene ethynylene)(PPE), copolymers thereof, and combinations thereof.

15. The method of claim 11, wherein the stimuli-responsive polymer comprises one of poly(N-isopropylacrylamide) (PNIPAAm), copolymers thereof, and combinations thereof.

16. The method of claim 11, wherein the ionomer comprises one of poly(3,4-ethylenedioxythiophene) and polystyrene sulfonate, a mixture (PEDOT:PSS) thereof, copolymers thereof, and combinations thereof.

17. The method of claim 10, wherein the small molecule comprises one of a fullerene, a phthalocyanine, a chromophore, a quaternary ammonium salts (QAS) and combinations thereof.

18. The method of claim 17, wherein the chromophore comprises one of ruthenium dyes, ethyl violet dyes, and disperse red 1 dyes.

19. The method of claim 10, wherein the nanoparticle comprises one of quantum dots, a nanowire, a nanotube, and combinations thereof.

20. The method of claim 19, wherein the quantum dots comprise one of solid or core/shell configurations of inorganic semiconductor materials, metallic nanoparticles, metal oxide nanoparticles, and combinations thereof.

21. The method of claim 20, wherein the solid or core/shell configurations of inorganic semiconductor materials comprise one of II-VI, III-V, IV-VI binary compounds, group IV materials, and combinations thereof.

22. The method of claim 20, wherein the metallic nanoparticles comprise one of gold, silver, and combinations thereof.

23. The method of claim 20, wherein the metal oxide nanoparticles comprise one of zinc oxides, titanium oxides, and combinations thereof.

24. The method of claim 10, wherein the biologic comprises one of proteins, deoxyribonucleic acid (DNA), ribonucleic acid (RNA), complementary DNA (cDNA), oligopeptides, polypeptides, oligosaccharides, polysaccharides, lipids, and proteins.

25. The method of claim 1, wherein the target emulsion is frozen.

26. The method of claim 1, wherein the host matrix comprises one of aromatic compounds, alcohols, ketones, and halocarbons.

27. The method of claim 26, wherein the aromatic compounds comprise one of toluene, xylene, mesitylene, chlorobenzene, dichlorobenzene, trichlorobenzene, tetrahydrofuran, and combinations thereof.

28. The method of claim 26, wherein the alcohols comprise one of methanol, ethanol, isopropanol, benzyl alcohol, and phenol.

29. The method of claim 26, wherein the ketones comprise one of acetone and methyl ethyl ketone (MEK).

30. The method of claim 26, wherein the halocarbons comprise one of trichloroethylene and chloroform.

31. The method of claim 1, wherein the substrate comprises a silicon-based readout circuit.

32. The method of claim 1, wherein the substrate comprises a piezoelectric material.

33. The method of claim 1, wherein the substrate comprises one of a chemical sensing device and a biochemical sensing device.

34. The method of claim 1, wherein the substrate comprises an acoustic wave device.

35. The method of claim 1, wherein the substrate comprises a non-planar surface.

36. The method of claim 1, further comprising repeating the steps of combining and exposing with a plurality of guest materials to thereby create a multi-layer film on the substrate.

37. The method of claim 1, further comprising rotating the target emulsion such that the infrared source rasters along one or between two or more of the concentric rings.

38. The method of claim 1, further comprising applying laser pulses to different materials of the target emulsion, the laser pulses being spatially alternated between the different materials for determining the structure of a resulting mixed composition film.

39. The method of claim 38, wherein applying laser pulses comprises timing the laser pulses for determining the structure of the resulting mixed composition film.

40. The method of claim 38, wherein applying laser pulses comprises rapidly alternating applied pulses among two or more different materials to produce a blended composite film in which the spatial extent of each material domain is about 1 micrometer or less in size within the film.

41. The method of claim 38, wherein applying laser pulses comprises alternating the laser pulses between two or more target materials at fixed intervals to produce a composite film comprising alternating layers of the target materials.

42. The method of claim 38, wherein applying laser pulses comprises alternating the laser pulses between two or more materials to produce one homogeneous material layer atop another homogeneous layer in a single deposition session.

43. The method of claim 38, wherein applying laser pulses comprises actively controlling the laser pulse timing between two or more materials to produce a film in which the ratio of the materials is varied throughout the film.

* * * * *